United States Patent
Lin et al.

(10) Patent No.: US 11,789,368 B2
(45) Date of Patent: Oct. 17, 2023

(54) LITHOGRAPHIC APPARATUS, METROLOGY SYSTEM, AND ILLUMINATION SYSTEMS WITH STRUCTURED ILLUMINATION

(71) Applicant: ASML Holding N.V., Veldhoven (NL)

(72) Inventors: Yuxiang Lin, Wilton, CT (US); Joshua Adams, Wilton, CT (US); Tamer Mohamed Tawfik Ahmed Mohamed Elazhary, New Canaan, CT (US); Krishanu Shome, Cheshire, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 17/764,139

(22) PCT Filed: Sep. 14, 2020

(86) PCT No.: PCT/EP2020/075668
§ 371 (c)(1),
(2) Date: Mar. 25, 2022

(87) PCT Pub. No.: WO2021/058313
PCT Pub. Date: Apr. 1, 2021

(65) Prior Publication Data
US 2022/0373895 A1 Nov. 24, 2022

Related U.S. Application Data

(60) Provisional application No. 62/907,028, filed on Sep. 27, 2019.

(51) Int. Cl.
*G03F 7/00* (2006.01)
(52) U.S. Cl.
CPC ........ *G03F 7/70191* (2013.01); *G03F 7/7085* (2013.01); *G03F 7/70091* (2013.01)

(58) Field of Classification Search
CPC .................. G03F 7/70191; G03F 7/70091
See application file for complete search history.

(56) References Cited

U.S. PATENT DOCUMENTS

| | | |
|---|---|---|
| 6,297,876 B1 | 10/2001 | Bornebroek |
| 6,961,116 B2 | 11/2005 | Den Boef et al. |

(Continued)

OTHER PUBLICATIONS

International Search Report and Written Opinion of the International Searching Authority directed to related International Patent Application No. PCT/EP2020/075668, dated Jan. 12, 2021; 11 pages.

(Continued)

*Primary Examiner* — Hung V Nguyen
(74) *Attorney, Agent, or Firm* — Sterne, Kessler, Goldstein & Fox P.L.L.C.

(57) ABSTRACT

A system (500) includes an illumination system (502), a lens element (506), and a detector (504). The illumination system generates a beam of radiation (510) having a first spatial intensity distribution (800) at a pupil plane (528) and a second spatial intensity distribution (900) at a plane of a target (514). The first spatial intensity distribution comprises an annular intensity profile (802) or an intensity profile corresponding to three or more beams. The lens element focuses the beam onto the target. The second spatial intensity distribution is a conjugate of the first intensity distribution and has an intensity profile corresponding to a central beam (902) and one or more side lobes (904) that are substantially isolated from the central beam. The central beam has a beam diameter of approximately 20 microns or less at the target. The detector receives radiation scattered by the target and generates a measurement signal based on the received radiation.

20 Claims, 12 Drawing Sheets

(56) References Cited

U.S. PATENT DOCUMENTS

| | | | |
|---|---|---|---|
| 7,511,799 | B2 | 3/2009 | Tel et al. |
| 8,706,442 | B2 | 4/2014 | Mos et al. |
| 10,852,247 | B2 * | 12/2020 | Smirnov ............ G03F 7/70616 |
| 11,119,415 | B2 * | 9/2021 | De Boer ............ G01N 21/8806 |
| 2009/0195768 | A1 | 8/2009 | Bijnen et al. |
| 2011/0196646 | A1 | 8/2011 | Mos et al. |
| 2012/0268725 | A1 | 10/2012 | De Boer et al. |
| 2016/0179019 | A1 | 6/2016 | Van Der Schaar et al. |
| 2018/0136568 | A1 | 5/2018 | Roobol et al. |
| 2019/0025714 | A1 | 1/2019 | Pisarenco et al. |
| 2019/0041329 | A1 | 2/2019 | Hill et al. |
| 2019/0199969 | A1 | 6/2019 | Betzig et al. |

OTHER PUBLICATIONS

International Preliminary Report on Patentability directed to related International Patent Application No. PCT/EP2020/075668, dated Mar. 15, 2022; 8 pages.

Raymond et al., "Multiparameter grating metrology using optical scatterometry," Journal of Vacuum Science & Technology B: Microelectronics and Nanometer Structures Processing, Measurement, and Phenomena, vol. 15, No. 2, May 24, 1996; pp. 361-368.

Niu et al., "Specular Spectroscopic Scatterometry in DUV Lithography," Proc. Of SPIE, Metrology, Inspection, and Process Control for Microlithography XIII, vol. 3677, Jun. 14, 1999; 10 pages.

\* cited by examiner

LITHOGRAPHIC APPARATUS, METROLOGY SYSTEM, AND ILLUMINATION SYSTEMS WITH STRUCTURED ILLUMINATION

CROSS-REFERENCE TO RELATED APPLICATIONS

This application claims priority of U.S. Provisional Patent Application No. 62/907,028, which was filed on Sep. 27, 2019, and which is incorporated herein in its entirety by reference.

FIELD

The present disclosure relates to metrology systems, for example, metrology systems having illumination systems capable of generating structured illumination for use in lithographic apparatuses and systems.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, can be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel to this scanning direction. It is also possible to transfer the pattern from the patterning device to the substrate by imprinting the pattern onto the substrate.

Another lithographic system is an interferometric lithographic system where there is no patterning device, but rather a light beam is split into two beams, and the two beams are caused to interfere at a target portion of the substrate through the use of a reflection system. The interference causes lines to be formed at the target portion of the substrate.

During lithographic operation, different processing steps may require different layers to be sequentially formed on the substrate. Accordingly, it can be necessary to position the substrate relative to prior patterns formed thereon with a high degree of accuracy. Generally, alignment marks are placed on the substrate to be aligned and are located with reference to a second object. A lithographic apparatus may use an inspection apparatus (e.g., alignment apparatus) for detecting positions of the alignment marks and for aligning the substrate using the alignment marks to ensure accurate exposure from a mask. Misalignment between the alignment marks at two different layers is measured as overlay error.

In order to monitor the lithographic process, parameters of the patterned substrate are measured. Parameters may include, for example, the overlay error between successive layers formed in or on the patterned substrate and critical linewidth of developed photosensitive resist. This measurement can be performed on a product substrate and/or on a dedicated metrology target. There are various techniques for making measurements of the microscopic structures formed in lithographic processes, including the use of scanning electron microscopes and various specialized tools. A fast and non-invasive form of a specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Spectroscopic scatterometers direct a broadband radiation beam onto the substrate and measure the spectrum (intensity as a function of wavelength) of the radiation scattered into a particular narrow angular range. By contrast, angularly resolved scatterometers may use a monochromatic radiation beam and measure the intensity of the scattered radiation as a function of angle.

Such optical scatterometers can be used to measure parameters, such as critical dimensions of developed photosensitive resist or overlay error (OV) between two layers formed in or on the patterned substrate. Properties of the substrate can be determined by comparing the properties of an illumination beam before and after the beam has been reflected or scattered by the substrate.

As ICs become smaller and more densely packed, so too are increases in the number of features that must be inspected per wafer. It is desirable to improve the capabilities of metrology systems in order to keep pace with current high-volume manufacturing rates and improve production yields. Accordingly, there is a need to provide metrology tools capable of accurately measuring a large number of densely packed lithographic features. Metrology solutions may include, e.g., reducing the sensitivity of sensors to extraneous structures surrounding a metrology target.

SUMMARY

In some embodiments, a system comprises an illumination system, a lens element, and a detector. The illumination system is configured to generate a beam of radiation having a first spatial intensity distribution at a pupil plane and a second spatial intensity distribution at a plane of a target. The first spatial intensity distribution comprises an annular intensity profile or an intensity profile corresponding to three or more beams. The lens element is configured to focus the beam onto the target. The second spatial intensity distribution is a conjugate of the first intensity distribution and comprises an intensity profile corresponding to a central beam and one or more side lobes that are substantially isolated from the central beam. The central beam has a beam diameter of approximately 20 microns or less at the target. The detector is configured to receive radiation scattered by the target and to generate a measurement signal based on the received radiation.

In some embodiments, a system comprises an illumination system, a lens element, and a detector. The illumination system comprises an annular optical element or a beam splitting element. The illumination system is configured to generate a beam of radiation having a first spatial intensity distribution at a pupil plane and a second spatial intensity distribution at a plane of a target, wherein the first spatial intensity distribution comprises an annular intensity profile or an intensity profile corresponding to three or more beams. The annular optical element is configured to generate the annular intensity profile of the first spatial intensity distribution. The beam splitting element is configured to split the beam to generate the intensity profile corresponding to the three or more beams of the first spatial intensity distribution. The lens element is configured to focus the beam onto the target. The second spatial intensity distribution is a conjugate of the first intensity distribution and comprises an intensity profile corresponding to a central beam and one or more side lobes that are substantially isolated from the central beam. The detector is configured to receive radiation scattered by the target and to generate a measurement signal based on the received radiation.

In some embodiments, a system comprises an illumination system, a lens element, and a detector. The illumination system comprises three or more radiation sources. The illumination system is configured to generate a beam of radiation having a first spatial intensity distribution at a pupil plane and a second spatial intensity distribution at a plane of a target, wherein the first spatial intensity distribution comprises an intensity profile corresponding to three or more beams. The three or more radiation sources are configured to correspondingly generate the three or more beams. The lens element configured to focus the three or more beams onto the target. The second spatial intensity distribution is a conjugate of the first intensity distribution and comprises an intensity profile corresponding to a central beam and one or more side lobes that are substantially isolated from the central beam. The detector is configured to receive radiation scattered by the target and to generate a measurement signal based on the received radiation.

In some embodiments, A lithographic apparatus comprises a first illumination system, a support, a substrate table, a projection system, and a metrology system. The metrology system comprises a second illumination system, a lens element, and a detector. The first illumination system is configured to illuminate a pattern of a patterning device. The support is configured to support the patterning device. The substrate table is configured to support a substrate. The projection system is configured to project an image of the pattern onto the substrate. The second illumination system is configured to generate a beam of radiation having a first spatial intensity distribution at a pupil plane and a second spatial intensity distribution at a plane of a target on the substrate. The first spatial intensity distribution comprises an annular intensity profile or an intensity profile corresponding to three or more beams. The lens element is configured to focus the beam onto the target. The second spatial intensity distribution is a conjugate of the first intensity distribution and comprises an intensity profile corresponding to a central beam and one or more side lobes that are substantially isolated from the central beam. The central beam has a beam diameter of approximately less than 20 microns at the target. The detector is configured to receive radiation scattered by the target and to generate a measurement signal based on the received radiation.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1A:
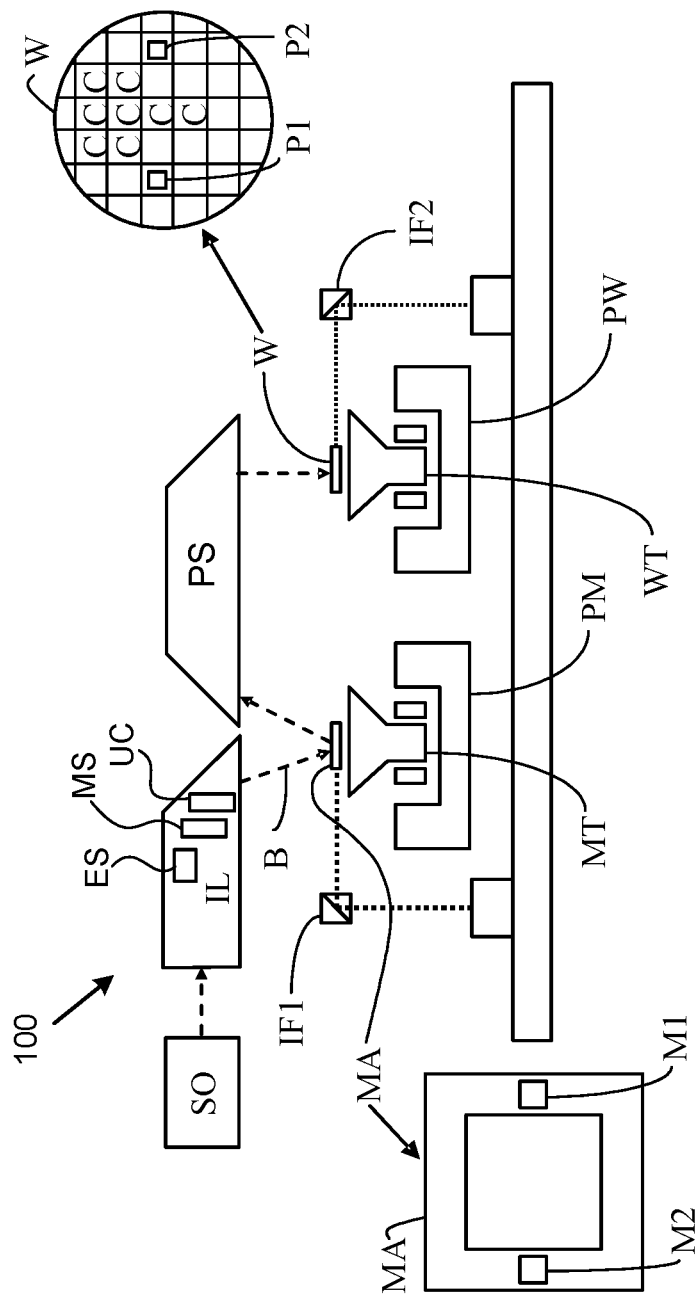
FIG. 1A shows a schematic of a reflective lithographic apparatus, according to some embodiments.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the disclosure can be implemented in hardware, firmware, software, or any combination thereof. Embodiments of the disclosure may also be implemented as instructions stored on a machine-readable medium, which can be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions can be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present disclosure can be implemented.

Example Lithographic Systems

Figure 1B:
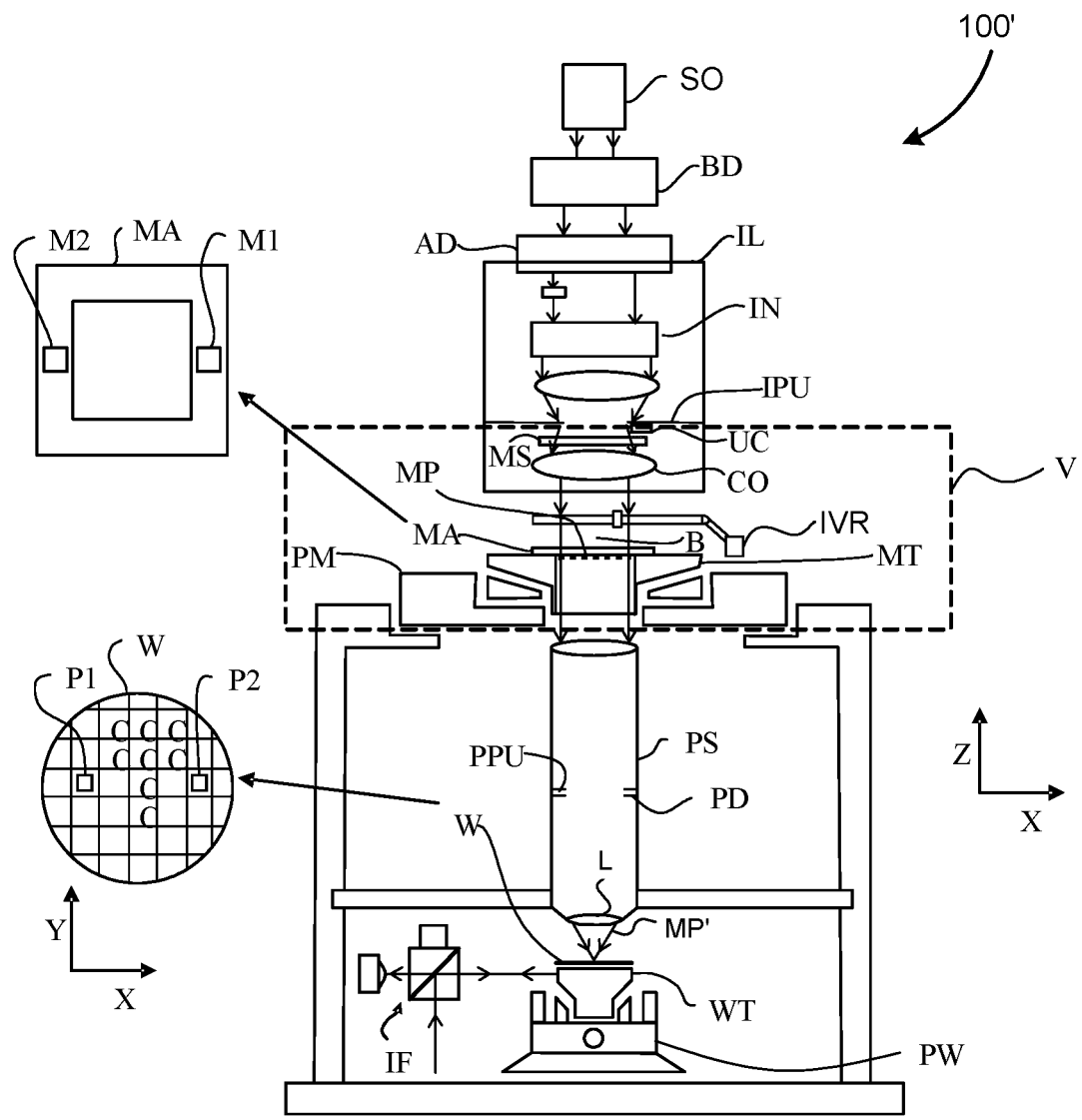
FIG. 1B shows a schematic of a transmissive lithographic apparatus, according to some embodiments.

FIGS. 1A and 1B show schematic illustrations of a lithographic apparatus 100 and lithographic apparatus 100', respectively, in which embodiments of the present disclosure may be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT may be a frame or a table, for example, which may be fixed or movable, as required. By using sensors, the support structure MT may ensure that the patterning device MA is at a desired position, for example, with respect to the projection system PS.

The term "patterning device" MA should be broadly interpreted as referring to any device that may be used to impart a radiation beam B with a pattern in its cross-section, such as to create a pattern in the target portion C of the substrate W. The pattern imparted to the radiation beam B may correspond to a particular functional layer in a device being created in the target portion C to form an integrated circuit.

The terms "inspection apparatus," "metrology apparatus," and the like may be used herein to refer to, e.g., a device or system used for measuring a property of a structure (e.g., overlay error, critical dimension parameters) or used in a lithographic apparatus to inspect an alignment of a wafer (e.g., alignment apparatus).

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, or programmable LCD panels. Masks are well known in lithography, and include mask types such as binary, alternating phase shift, or attenuated phase shift, as well as various hybrid mask types. An example of a programmable mirror array employs a matrix arrangement of small mirrors, each of which may be individually tilted so as to reflect an incoming radiation beam in different directions. The tilted mirrors impart a pattern in the radiation beam B, which is reflected by a matrix of small mirrors.

The term "projection system" PS may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment may be used for EUV or electron beam radiation since other gases may absorb too much radiation or electrons. A vacuum environment may therefore be provided to the whole beam path with the aid of a vacuum wall and vacuum pumps.

Lithographic apparatus 100 and/or lithographic apparatus 100' may be of a type having two (dual stage) or more substrate tables WT (and/or two or more mask tables). In such "multiple stage" machines, the additional substrate tables WT may be used in parallel, or preparatory steps may be carried out on one or more tables while one or more other substrate tables WT are being used for exposure. In some situations, the additional table may not be a substrate table WT.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIGS. 1A and 1B, the illuminator IL receives a radiation beam from a radiation source SO. The source SO and the lithographic apparatus 100, 100' may be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO may be an integral part of the lithographic apparatus 100, 100', for example, when the source SO is a mercury lamp. The source SO and the illuminator IL, together with the beam delivery system BD, if required, may be referred to as a radiation system.

The illuminator IL may include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator may be adjusted. In addition, the illuminator IL may comprise various other components (in FIG. 1B), such as an integrator IN and a condenser CO. The illuminator IL may be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT may be moved accurately (for example, so as to position different target portions C in the path of the radiation beam B). Similarly, the first positioner PM and another position sensor IF1 may be used to accurately position the patterning device (for example, mask) MA with respect to the path of the radiation beam B. Patterning device (for example, mask) MA and substrate W may be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil conjugate PPU to an illumination system pupil IPU. Portions of radiation emanate from the intensity distribution at the illumination system pupil IPU and traverse a mask pattern without being affected by diffraction at the mask pattern and create an image of the intensity distribution at the illumination system pupil IPU.

The projection system PS projects an image MP' of the mask pattern MP, where image MP' is formed by diffracted beams produced from the mark pattern MP by radiation from the intensity distribution, onto a photoresist layer coated on the substrate W. For example, the mask pattern MP may include an array of lines and spaces. A diffraction of radiation at the array and different from zeroth order diffraction generates diverted diffracted beams with a change of direction in a direction perpendicular to the lines. Undiffracted beams (i.e., so-called zeroth order diffracted beams) traverse the pattern without any change in propagation direction. The zeroth order diffracted beams traverse an upper lens or upper lens group of the projection system PS, upstream of the pupil conjugate PPU of the projection system PS, to reach the pupil conjugate PPU. The portion of the intensity distribution in the plane of the pupil conjugate PPU and associated with the zeroth order diffracted beams is an image of the intensity distribution in the illumination system pupil IPU of the illumination system IL. The aperture device PD, for example, is disposed at or substantially at a plane that includes the pupil conjugate PPU of the projection system PS.

The projection system PS is arranged to capture, by means of a lens or lens group L, not only the zeroth order diffracted beams, but also first-order or first- and higher-order diffracted beams (not shown). In some embodiments, dipole illumination for imaging line patterns extending in a direction perpendicular to a line may be used to utilize the resolution enhancement effect of dipole illumination. For example, first-order diffracted beams interfere with corresponding zeroth-order diffracted beams at the level of the wafer W to create an image of the line pattern MP at highest possible resolution and process window (i.e., usable depth of focus in combination with tolerable exposure dose deviations). In some embodiments, astigmatism aberration may be reduced by providing radiation poles (not shown) in opposite quadrants of the illumination system pupil IPU. Further, in some embodiments, astigmatism aberration may be reduced by blocking the zeroth order beams in the pupil conjugate PPU of the projection system associated with radiation poles in opposite quadrants. This is described in more detail in U.S. Pat. No. 7,511,799 B2, issued Mar. 31, 2009, which is incorporated by reference herein in its entirety.

With the aid of the second positioner PW and position sensor IF (for example, an interferometric device, linear encoder, or capacitive sensor), the substrate table WT may be moved accurately (for example, so as to position different target portions C in the path of the radiation beam B). Similarly, the first positioner PM and another position sensor (not shown in FIG. 1B) may be used to accurately position the mask MA with respect to the path of the radiation beam B (for example, after mechanical retrieval from a mask library or during a scan).

In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner), the mask table MT may be connected to a short-stroke actuator only or may be fixed. Mask MA and substrate W may be aligned using mask alignment marks M1, M2, and substrate alignment marks P1, P2. Although the substrate alignment marks (as illustrated) occupy dedicated target portions, they may be located in spaces between target portions (known as scribe-lane alignment marks). Similarly, in situations in which more than one die is provided on the mask MA, the mask alignment marks may be located between the dies.

Mask table MT and patterning device MA may be in a vacuum chamber V, where an in-vacuum robot IVR may be used to move patterning devices such as a mask in and out of vacuum chamber. Alternatively, when mask table MT and patterning device MA are outside of the vacuum chamber, an out-of-vacuum robot may be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' may be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C may be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT may be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO may be employed and the programmable patterning device is updated as required after each movement of the substrate table WT or in between successive radiation pulses during a scan. This mode of operation may be readily applied to maskless lithography that utilizes a programmable patterning device, such as a programmable mirror array.

Combinations and/or variations on the described modes of use or entirely different modes of use may also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
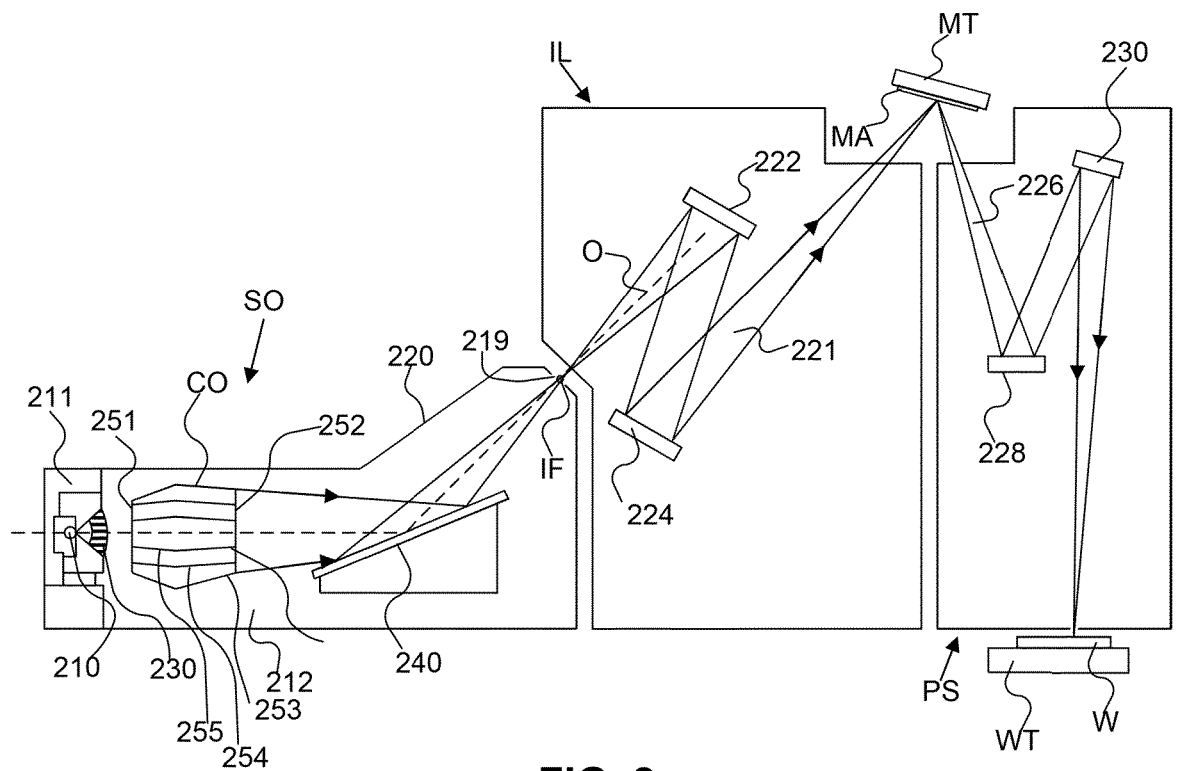
FIG. 2 shows a more detailed schematic of the reflective lithographic apparatus, according to some embodiments.

FIG. 2 shows the lithographic apparatus 100 in more detail, including the source collector apparatus SO, the illumination system IL, and the projection system PS. The source collector apparatus SO is constructed and arranged such that a vacuum environment may be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor, or Sn vapor in which the very hot plasma 210 is created to emit radiation in the EUV range of the electromagnetic spectrum. The very hot plasma 210 is created by, for example, an electrical discharge causing at least a partially ionized plasma. Partial pressures of, for example, 10 Pa of Xe, Li, Sn vapor, or any other suitable gas or vapor may be required for efficient generation of the radiation. In some embodiments, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap), which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure.

The collector chamber 212 may include a radiation collector CO, which may be a so-called grazing incidence collector. Radiation collector CO has an upstream radiation collector side 251 and a downstream radiation collector side 252. Radiation that traverses collector CO may be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the FIG. 2, for example there may be one to six additional reflective elements present in the projection system PS than shown in FIG. 2.

Collector optic CO, as illustrated in FIG. 2, is depicted as a nested collector with grazing incidence reflectors 253, 254, and 255, just as an example of a collector (or collector mirror). The grazing incidence reflectors 253, 254, and 255 are disposed axially symmetric around an optical axis O and a collector optic CO of this type is preferably used in combination with a discharge produced plasma source, often called a DPP source.

Exemplary Lithographic Cell

Figure 3:
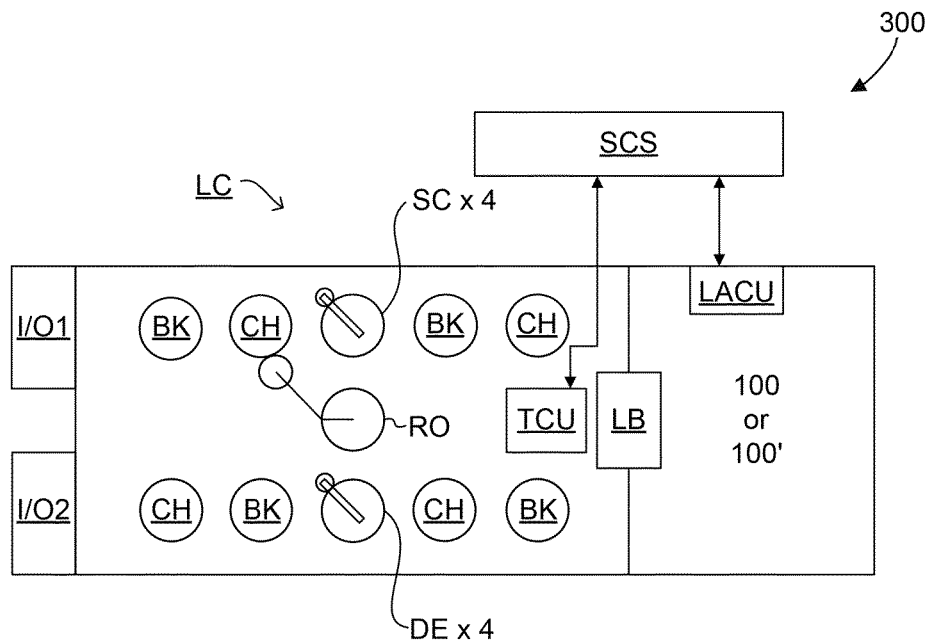
FIG. 3 shows a schematic of a lithographic cell, according to some embodiments.

FIG. 3 shows a lithographic cell 300, also sometimes referred to a lithocell or cluster, according to some embodiments. Lithographic apparatus 100 or 100' may form part of lithographic cell 300. Lithographic cell 300 may also include one or more apparatuses to perform pre- and post-exposure processes on a substrate. Conventionally these include spin coaters SC to deposit resist layers, developers DE to develop exposed resist, chill plates CH, and bake plates BK. A substrate handler, or robot, RO picks up substrates from input/output ports I/O1, I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses may be operated to maximize throughput and processing efficiency.

Exemplary Inspection Apparatus

In order to control the lithographic process to place device features accurately on the substrate, alignment marks are generally provided on the substrate, and the lithographic apparatus includes one or more alignment apparatuses and/or systems by which positions of marks on a substrate must be measured accurately. These alignment apparatuses are effectively position measuring apparatuses. Different types of marks and different types of alignment apparatuses and/or systems are known from different times and different manufacturers. A type of system widely used in current lithographic apparatus is based on a self-referencing interferometer as described in U.S. Pat. No. 6,961,116 (den Boef et al.). Generally marks are measured separately to obtain X- and Y-positions. A combined X- and Y-measurement may be performed using the techniques described in U.S. Publication No. 2009/195768 A (Bijnen et al.), however. The full contents of both of these disclosures are incorporated herein by reference.

Figure 4A:
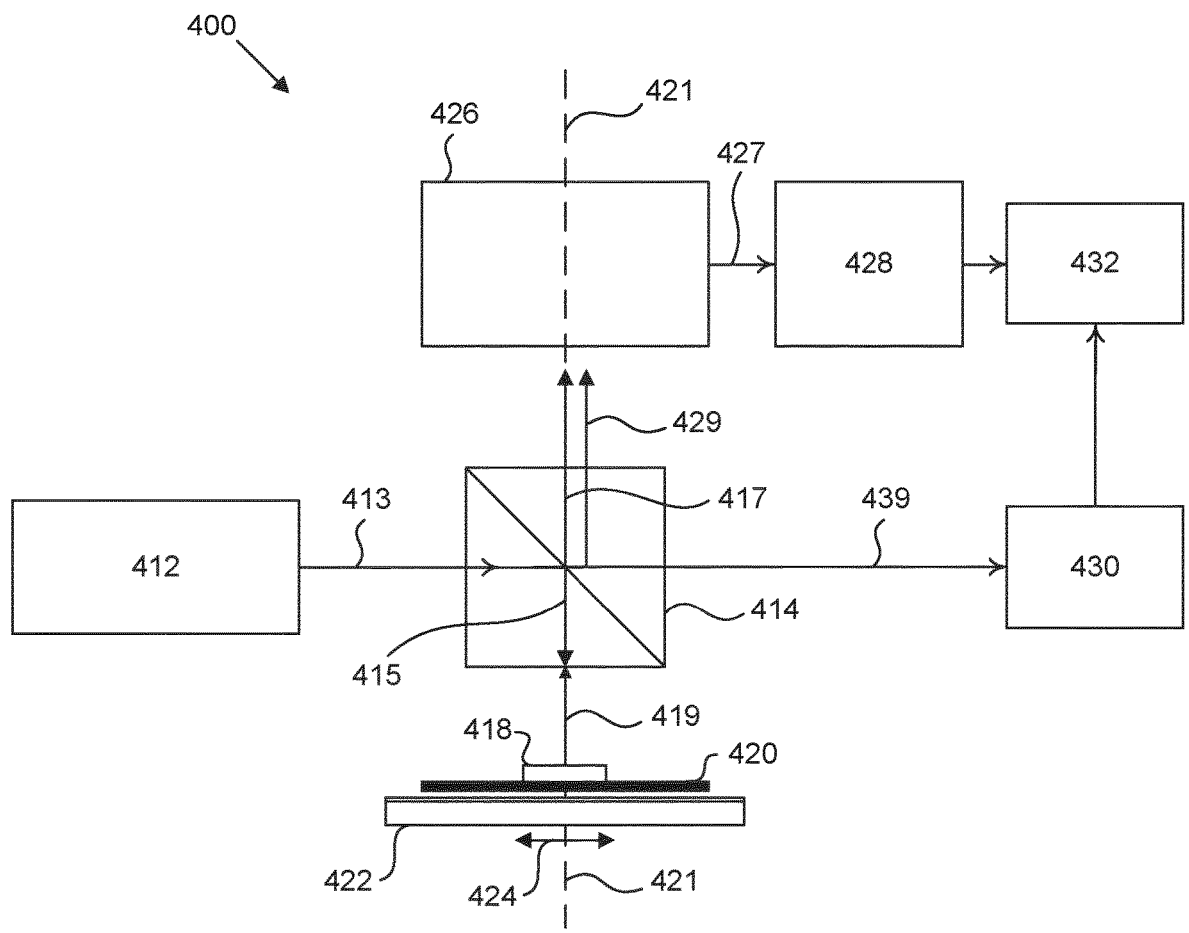
FIGS. 4A and 4B show schematics of inspection apparatuses, according to some embodiments.

FIG. 4A shows a schematic of a cross-sectional view of an inspection apparatus 400, according to some embodiments. In some embodiments, inspection apparatus 400 may be implemented as part of lithographic apparatus 100 or 100'. Inspection apparatus 400 may be configured to align a substrate (e.g., substrate W) with respect to a patterning device (e.g., patterning device MA). Inspection apparatus 400 may be further configured to detect positions of alignment marks on the substrate and to align the substrate with respect to the patterning device or other components of lithographic apparatus 100 or 100' using the detected positions of the alignment marks. Such alignment of the substrate may ensure accurate exposure of one or more patterns on the substrate.

In some embodiments, inspection apparatus 400 may include an illumination system 412, a beam splitter 414, an interferometer 426, a detector 428, a beam analyzer 430, and an overlay calculation processor 432. Illumination system 412 may be configured to provide an electromagnetic narrow band radiation beam 413 having one or more passbands. In an example, the one or more passbands may be within a spectrum of wavelengths between about 500 nm to about 900 nm. In another example, the one or more passbands may be discrete narrow passbands within a spectrum of wavelengths between about 500 nm to about 900 nm. Illumination system 412 may be further configured to provide one or more passbands having substantially constant center wavelength (CWL) values over a long period of time (e.g., over a lifetime of illumination system 412). Such configuration of illumination system 412 may help to prevent the shift of the actual CWL values from the desired CWL values, as discussed above, in current alignment systems. And, as a result, the use of constant CWL values may improve long-term stability and accuracy of alignment systems (e.g., inspection apparatus 400) compared to the current alignment apparatuses.

In some embodiments, beam splitter 414 may be configured to receive radiation beam 413 and split radiation beam 413 into at least two radiation sub-beams. For example, radiation beam 413 may be split into radiation sub-beams 415 and 417, as shown in FIG. 4A. Beam splitter 414 may be further configured to direct radiation sub-beam 415 onto a substrate 420 placed on a stage 422. In one example, the stage 422 is movable along direction 424. Radiation sub-beam 415 may be configured to illuminate an alignment mark or a target 418 located on substrate 420. Alignment mark or target 418 may be coated with a radiation sensitive film. In some embodiments, alignment mark or target 418 may have one hundred and eighty degrees (i.e., 180°) symmetry. That is, when alignment mark or target 418 is rotated 180° about an axis of symmetry perpendicular to a plane of alignment mark or target 418, rotated alignment mark or target 418 may be substantially identical to an unrotated alignment mark or target 418. The target 418 on substrate 420 may be (a) a resist layer grating comprising bars that are formed of solid resist lines, or (b) a product layer grating, or (c) a composite grating stack in an overlay target structure comprising a resist grating overlaid or interleaved on a product layer grating. The bars may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. One in-line method used in device manufacturing for measurements of line width, pitch, and critical dimension makes use of a technique known as "scatterometry". Methods of scatterometry are described in Raymond et al., "Multiparameter Grating Metrology Using Optical Scatterometry", J. Vac. Sci. Tech. B, Vol. 15, no. 2, pp. 361-368 (1997) and Niu et al., "Specular Spectroscopic Scatterometry in DUV Lithography", SPIE, Vol. 3677 (1999), which are both incorporated by reference herein in their entireties. In scatterometry, light is reflected by periodic structures in the target, and the resulting reflection spectrum at a given angle is detected. The structure giving rise to the reflection spectrum is reconstructed, e.g. using Rigorous Coupled-Wave Analysis (RCWA) or by comparison to a library of patterns derived by simulation. Accordingly, the scatterometry data of the printed gratings is used to reconstruct the gratings. The parameters of the grating, such as line widths and shapes, may be input to the reconstruction process, performed by processing unit PU, from knowledge of the printing step and/or other scatterometry processes.

In some embodiments, beam splitter 414 may be further configured to receive diffraction radiation beam 419 and split diffraction radiation beam 419 into at least two radiation sub-beams, according to an embodiment. Diffraction radiation beam 419 may be split into diffraction radiation sub-beams 429 and 439, as shown in FIG. 4A.

It should be noted that even though beam splitter 414 is shown to direct radiation sub-beam 415 towards alignment mark or target 418 and to direct diffracted radiation sub-beam 429 towards interferometer 426, the disclosure is not so limiting. It would be apparent to a person skilled in the relevant art that other optical arrangements may be used to obtain the similar result of illuminating alignment mark or target 418 on substrate 420 and detecting an image of alignment mark or target 418.

As illustrated in FIG. 4A, interferometer 426 may be configured to receive radiation sub-beam 417 and diffracted radiation sub-beam 429 through beam splitter 414. In an example embodiment, diffracted radiation sub-beam 429 may be at least a portion of radiation sub-beam 415 that may be reflected from alignment mark or target 418. In an example of this embodiment, interferometer 426 comprises any appropriate set of optical-elements, for example, a combination of prisms that may be configured to form two images of alignment mark or target 418 based on the received diffracted radiation sub-beam 429. It should be appreciated that a good quality image need not be formed, but that the features of alignment mark 418 should be resolved. Interferometer 426 may be further configured to rotate one of the two images with respect to the other of the two images 180° and recombine the rotated and unrotated images interferometrically.

In some embodiments, detector 428 may be configured to receive the recombined image via interferometer signal 427 and detect interference as a result of the recombined image when alignment axis 421 of inspection apparatus 400 passes through a center of symmetry (not shown) of alignment mark or target 418. Such interference may be due to alignment mark or target 418 being 180° symmetrical, and the recombined image interfering constructively or destructively, according to an example embodiment. Based on the detected interference, detector 428 may be further configured to determine a position of the center of symmetry of alignment mark or target 418 and consequently, detect a position of substrate 420. According to an example, alignment axis 421 may be aligned with an optical beam perpendicular to substrate 420 and passing through a center of image rotation interferometer 426. Detector 428 may be further configured to estimate the positions of alignment mark or target 418 by implementing sensor characteristics and interacting with wafer mark process variations.

In a further embodiment, detector 428 determines the position of the center of symmetry of alignment mark or target 418 by performing one or more of the following measurements:
1. measuring position variations for various wavelengths (position shift between colors);
2. measuring position variations for various orders (position shift between diffraction orders); and
3. measuring position variations for various polarizations (position shift between polarizations).
This data may, for example, be obtained with any type of alignment sensor, for example a SMASH (SMart Alignment Sensor Hybrid) sensor, as described in U.S. Pat. No. 6,961,116 that employs a self-referencing interferometer with a single detector and four different wavelengths, and extracts the alignment signal in software, or Athena (Advanced Technology using High order ENhancement of Alignment), as described in U.S. Pat. No. 6,297,876, which directs each of seven diffraction orders to a dedicated detector, which are both incorporated by reference herein in their entireties.

In some embodiments, beam analyzer 430 may be configured to receive and determine an optical state of diffracted radiation sub-beam 439. The optical state may be a measure of beam wavelength, polarization, or beam profile. Beam analyzer 430 may be further configured to determine a position of stage 422 and correlate the position of stage 422 with the position of the center of symmetry of alignment mark or target 418. As such, the position of alignment mark or target 418 and, consequently, the position of substrate 420 may be accurately known with reference to stage 422. Alternatively, beam analyzer 430 may be configured to determine a position of inspection apparatus 400 or any other reference element such that the center of symmetry of alignment mark or target 418 may be known with reference to inspection apparatus 400 or any other reference element. Beam analyzer 430 may be a point or an imaging polarimeter with some form of wavelength-band selectivity. In some embodiments, beam analyzer 430 may be directly integrated into inspection apparatus 400, or connected via fiber optics of several types: polarization preserving single mode, multimode, or imaging, according to other embodiments.

In some embodiments, beam analyzer 430 may be further configured to determine the overlay data between two patterns on substrate 420. One of these patterns may be a reference pattern on a reference layer. The other pattern may be an exposed pattern on an exposed layer. The reference layer may be an etched layer already present on substrate 420. The reference layer may be generated by a reference pattern exposed on the substrate by lithographic apparatus 100 and/or 100'. The exposed layer may be a resist layer exposed adjacent to the reference layer. The exposed layer may be generated by an exposure pattern exposed on substrate 420 by lithographic apparatus 100 or 100'. The exposed pattern on substrate 420 may correspond to a movement of substrate 420 by stage 422. In some embodiments, the measured overlay data may also indicate an offset between the reference pattern and the exposure pattern. The measured overlay data may be used as calibration data to calibrate the exposure pattern exposed by lithographic apparatus 100 or 100', such that after the calibration, the offset between the exposed layer and the reference layer may be minimized.

In some embodiments, beam analyzer 430 may be further configured to determine a model of the product stack profile of substrate 420, and may be configured to measure overlay, critical dimension, and focus of target 418 in a single measurement. The product stack profile contains information on the stacked product such as alignment mark, target 418, or substrate 420, and may include mark process variation-induced optical signature metrology that is a function of illumination variation. The product stack profile may also include product grating profile, mark stack profile, and mark asymmetry information. An example of beam analyzer 430 may be found in the metrology apparatus known as Yieldstar™ manufactured by ASML, Veldhoven, The Netherlands, as described in U.S. Pat. No. 8,706,442, which is incorporated by reference herein in its entirety. Beam analyzer 430 may be further configured to process information related to a particular property of an exposed pattern in that layer. For example, beam analyzer 430 may process an overlay parameter (an indication of the positioning accuracy of the layer with respect to a previous layer on the substrate or the positioning accuracy of the first layer with respective to marks on the substrate), a focus parameter, and/or a critical dimension parameter (e.g., line width and its variations) of the depicted image in the layer. Other parameters are image parameters relating to the quality of the depicted image of the exposed pattern.

In some embodiments, an array of detectors (not shown) may be connected to beam analyzer 430, and allows the possibility of accurate stack profile detection as discussed below. For example, detector 428 may be an array of detectors. For the detector array, a number of options are possible: a bundle of multimode fibers, discrete pin detectors per channel, or CCD or CMOS (linear) arrays. The use of a bundle of multimode fibers enables any dissipating elements to be remotely located for stability reasons. Discrete PIN detectors offer a large dynamic range but each need separate pre-amps. The number of elements is therefore limited. CCD linear arrays offer many elements that may be read-out at high speed and are especially of interest if phase-stepping detection is used.

Figure 4B:
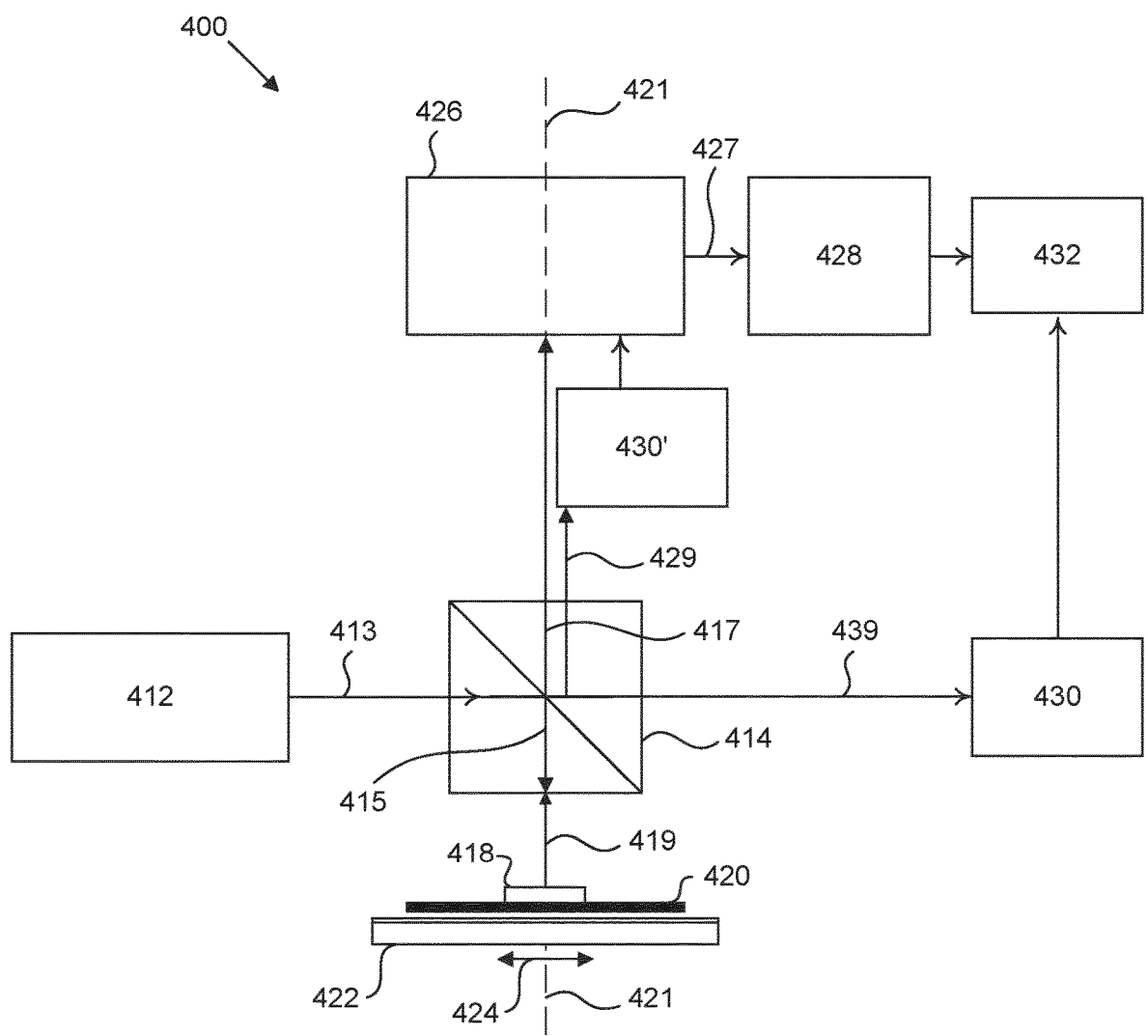

In some embodiments, a second beam analyzer 430' may be configured to receive and determine an optical state of diffracted radiation sub-beam 429, as shown in FIG. 4B. The optical state may be a measure of beam wavelength, polarization, or beam profile. Second beam analyzer 430' may be identical to beam analyzer 430. Alternatively, second beam analyzer 430' may be configured to perform at least all the functions of beam analyzer 430, such as determining a position of stage 422 and correlating the position of stage 422 with the position of the center of symmetry of alignment mark or target 418. As such, the position of alignment mark or target 418 and, consequently, the position of substrate 420, may be accurately known with reference to stage 422. Second beam analyzer 430' may also be configured to determine a position of inspection apparatus 400, or any other reference element, such that the center of symmetry of alignment mark or target 418 may be known with reference to inspection apparatus 400, or any other reference element. Second beam analyzer 430' may be further configured to determine the overlay data between two patterns and a model of the product stack profile of substrate 420. Second beam analyzer 430' may also be configured to measure overlay, critical dimension, and focus of target 418 in a single measurement.

In some embodiments, second beam analyzer 430' may be directly integrated into inspection apparatus 400, or it may be connected via fiber optics of several types: polarization preserving single mode, multimode, or imaging, according to other embodiments. Alternatively, second beam analyzer 430' and beam analyzer 430 may be combined to form a single analyzer (not shown) configured to receive and determine the optical states of both diffracted radiation sub-beams 429 and 439.

In some embodiments, processor 432 receives information from detector 428 and beam analyzer 430. For example, processor 432 may be an overlay calculation processor. The information may comprise a model of the product stack profile constructed by beam analyzer 430. Alternatively, processor 432 may construct a model of the product mark profile using the received information about the product mark. In either case, processor 432 constructs a model of the stacked product and overlay mark profile using or incorporating a model of the product mark profile. The stack model is then used to determine the overlay offset and minimizes the spectral effect on the overlay offset measurement. Processor 432 may create a basic correction algorithm based on the information received from detector 428 and beam analyzer 430, including but not limited to the optical state of the illumination beam, the alignment signals, associated position estimates, and the optical state in the pupil, image, and additional planes. The pupil plane is the plane in which the radial position of radiation defines the angle of incidence and the angular position defines the azimuth angle of the radiation. Processor 432 may utilize the basic correction algorithm to characterize the inspection apparatus 400 with reference to wafer marks and/or alignment marks 418.

In some embodiments, processor 432 may be further configured to determine printed pattern position offset error with respect to the sensor estimate for each mark based on the information received from detector 428 and beam analyzer 430. The information includes but is not limited to the product stack profile, measurements of overlay, critical dimension, and focus of each alignment marks or target 418 on substrate 420. Processor 432 may utilize a clustering algorithm to group the marks into sets of similar constant offset error, and create an alignment error offset correction table based on the information. The clustering algorithm may be based on overlay measurement, the position estimates, and additional optical stack process information associated with each set of offset errors. The overlay is calculated for a number of different marks, for example, overlay targets having a positive and a negative bias around a programmed overlay offset. The target that measures the smallest overlay is taken as reference (as it is measured with the best accuracy). From this measured small overlay, and the known programmed overlay of its corresponding target, the overlay error may be deduced. Table 1 illustrates how this may be performed. The smallest measured overlay in the example shown is −1 nm. However this is in relation to a target with a programmed overlay of −30 nm. Consequently the process must have introduced an overlay error of 29 nm.

TABLE 1

|  | | | | | | | |
|---|---|---|---|---|---|---|---|
| Programmed overlay | −70 | −50 | −30 | −10 | 10 | 30 | 50 |
| Measured overlay | −38 | −19 | −1 | 21 | 43 | 66 | 90 |
| Difference between measured and programmed overlay | 32 | 31 | 29 | 31 | 33 | 36 | 40 |
| Overlay error | 3 | 2 | — | 2 | 4 | 7 | 11 |

The smallest value may be taken to be the reference point and, relative to this, the offset may be calculated between measured overlay and that expected due to the programmed overlay. This offset determines the overlay error for each mark or the sets of marks with similar offsets. Therefore, in the Table 1 example, the smallest measured overlay was −1 nm, at the target position with programmed overlay of 30 nm. The difference between the expected and measured overlay at the other targets is compared to this reference. A table such as Table 1 may also be obtained from marks and target 418 under different illumination settings, the illumination setting, which results in the smallest overlay error, and its corresponding calibration factor, may be determined and selected. Following this, processor 432 may group marks into sets of similar overlay error. The criteria for grouping marks may be adjusted based on different process controls, for example, different error tolerances for different processes.

In some embodiments, processor 432 may confirm that all or most members of the group have similar offset errors, and apply an individual offset correction from the clustering algorithm to each mark, based on its additional optical stack metrology. Processor 432 may determine corrections for each mark and feed the corrections back to lithographic apparatus 100 or 100' for correcting errors in the overlay, for example, by feeding corrections into the inspection apparatus 400.

Exemplary Structured Illumination System

As ICs continue to shrink, users of lithographic tools demand smaller alignment marks in their efforts to maximize efficient wafer use. A size of an alignment mark is generally dictated by the inspection apparatus(es) that will be measuring the alignment mark. For example, if an alignment mark is too small, a metrology tool that inspects the alignment mark may yield an inaccurate measurement. However, alignment marks occupy wafer real-estate that could be used for a product feature. An efficient use of wafer material is generally determined by the alignment mark, and therefore by the metrology apparatus.

Another aspect that is increasingly useful in the industry is the ability to perform intra-field alignment. A field is an area of the wafer that is exposed at one time by the lithographic tool. To expose the entire wafer, the field is, for example, tessellated across the entire surface area of the wafer. Intra-field alignment refers to a method of inspecting more than one alignment mark in a given field. With metrology apparatuses also becoming smaller, intra-field alignment can help boost accuracy of alignment in high-volume manufacturing, for example, by using multiple alignment apparatuses densely packed to inspect intra-field alignment marks.

However, small alignment marks pose challenges to current metrology apparatuses. To derive an accurate measurement from an alignment mark, in some embodiments, only the alignment mark (e.g., using a small illumination spot). In some embodiments, the illumination has a particular configuration (e.g., a narrowed range of angles of incidence, for example, approximately 5-15 degrees). Regarding the illumination of only the alignment mark, it is of relevance because alignment marks may be surrounded by other features (e.g., product features densely packed by a user) that may send stray photons toward the sensing element, thereby reducing accuracy of the measurement.

Figure 5:
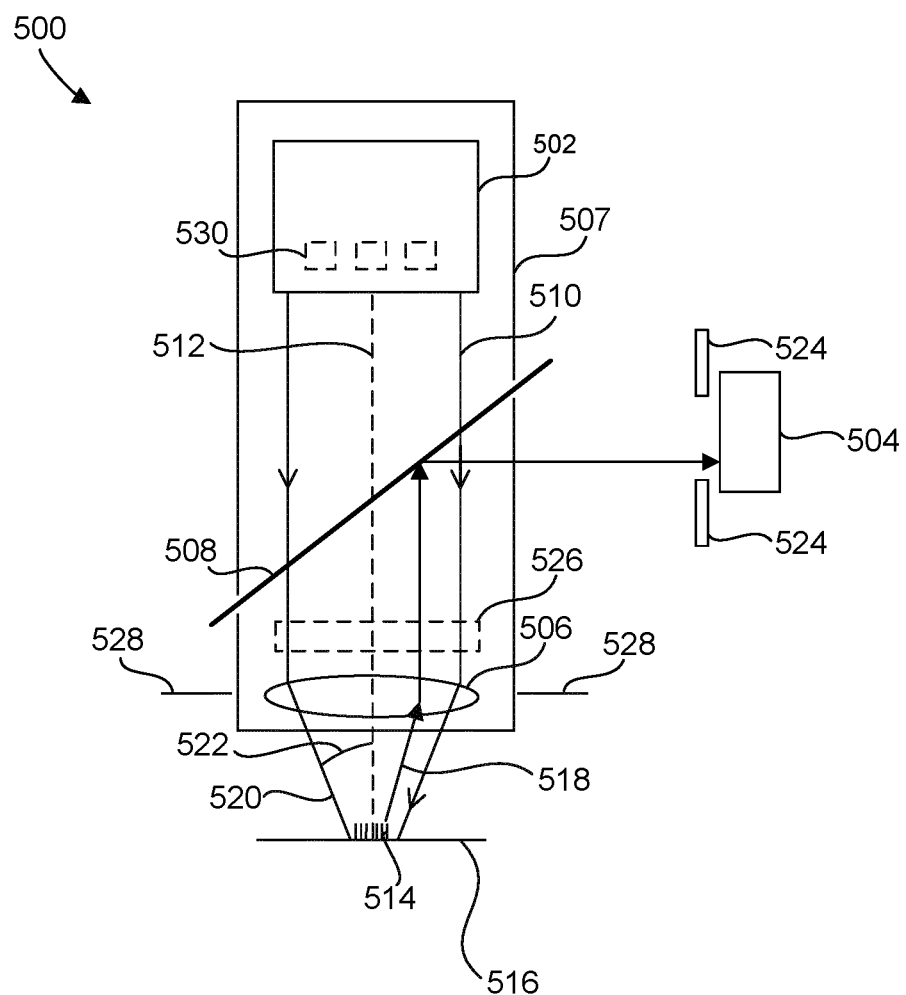
FIG. 5 shows a schematic of a metrology system, according to some embodiments.

FIG. 5 shows a schematic of a metrology system 500, according to some embodiments. In some embodiments, metrology system 500 comprises a radiation source 502, a detector 504, a lens element 506, and a radiation directing element 508. Lens element 506 may comprise a lens system (e.g., a plurality of lens elements). Radiation source 502 and lens element 506 may be part of an illumination system 507.

In some embodiments, radiation source 502 is configured to generate a beam of radiation 510. Beam of radiation 510 may travel along an optical axis 512 toward a target 514 (e.g., an alignment mark, periodic structure, grating, and the like). Target 514 may be disposed on a substrate 516 (e.g., a wafer). Lens element 506 may focus beam of radiation 510 onto substrate 516. Target 514 may comprise one or more layers of material (e.g., substrate stack, or simply stack) resulting from one or more lithographic processes. Radiation from beam of radiation 510 may scatter from target 514 as scattered radiation 518. Radiation directing element 508 may direct scattered radiation 518 toward detector 504. Detector 504 may receive scattered radiation 518. Detector 504 may generate a measurement signal based on receiving scattered radiation 518. Though the illumination branch depicted in FIG. 5 shows a straight line from radiation source 502 to target 514, it should be appreciated that any suitable illumination arrangement may be used (e.g., in FIG. 4, inspection apparatus 400 diverts the illumination path using beam splitter 414).

In some embodiments, beam of radiation 510, when focused, may form a cone of radiation 520 that forms a beam spot on the surface of substrate 516, for example, at target 514. Beam of radiation 510 may comprise a range of angles of incidence 522 that depends on the numerical aperture (NA) of lens element 506.

In some embodiments, lens element 506 has a low numerical aperture (NA). Focusing using a low NA lens may cause beam of radiation 510 to form a beam spot that is larger than the breadth of target 514. For example, in some embodiments, target 514 may be approximately 20 microns or less along its largest dimension. In some embodiments, the beam diameter of beam of radiation 510 is approximately 40 microns at target 514. In other words, target 514 may be overfilled with illumination. Consequently, the illumination spot on target 514 may also illuminate a sizeable area in the vicinity of target 514, where other lithographed structures may be present (e.g., product features).

In some embodiments, at detector (e.g., at the detector plane), scattered radiation originating from structures outside of target 514 may interfere with scattered radiation 518 from target 514. Undesirable interference of two optical signals may be referred to herein as "cross-talk." Cross-talk may increase the uncertainty of a measurement performed by the inspection apparatus.

In some embodiments, metrology system 500 may further comprise a blocking element 524 (e.g., a field stop, aperture stop, a filtering element, and the like). Scattered radiation originating from structures outside of target 514 may be blocked using blocking element 524. However, the use of a blocking element to filter out scattered radiation originating from structures outside of target 514 may be difficult, and may therefore not provide a sufficient reduction of cross-talk effects. Structures surrounding target 514 may be densely packed and disposed close to target 514. However, blocking element 524 may have a finite error tolerance for each degree of freedom of movement. In some embodiments, each of up to six degrees of freedom of blocking element 524 may have tight tolerance budgets (e.g., three translational and three rotational degrees of freedom). Therefore, blocking element 524 may fail to provide sufficient filtering of scattered radiation originating from structures outside of target 514. Even "good" signals from target 514 may be clipped.

Another problem that may arise with overfilling (e.g., when a user designs a target 514 that is small) is that radiation interactions with edge features on target 514 may occur, for example, diffraction similar to a single slit experiment. From a given location on target 514, a large output cone of rays may go through different parts of the pupil and experience different wavefronts and aberrations. Aberrations are converted into measurement error (e.g., alignment error).

To reduce uncertainties arising from cross-talk, in some embodiments, the beam diameter of beam of radiation 510 may be reduced. In some embodiments, lens element 506 has a high NA. Beam of radiation 510, when focused, may form cone of radiation 520 that forms a beam spot having a beam diameter that is smaller than the breadth of target 514 (i.e., target 514 is underfilled). That is, in some embodiments, beam of radiation 510 has a beam diameter of approximately 20 microns or less or less at target 514. However, in doing so, beam of radiation 510 may comprise a wide range of angles of incidence 522 (i.e., a more severely angled cone of radiation).

In some embodiments, beam of radiation 510 may not be a plane wave when it is focused as a cone onto substrate 516. Each discrete angle of incidence may interact with the substrate stack differently. For example, radiation incident on a given position of target 514 may generate multiple scattered radiation 518 having different qualities. In some embodiments, reflectivity and/or polarization of scattered radiation 518 may vary as a function of angle of incidence. A detector that receives radiation may be sensitive to the aggregate of all scattered radiation 518. Therefore, a larger illumination NA may exacerbate an uncertainty in the measurement result (e.g., a larger positioning uncertainty in an alignment measurement).

An ideal optical system is one that causes no aberrations to the different optical paths present within. But the reality is that, in some embodiments, optical systems may cause given optical paths to treat radiation differently (e.g., aberrations). Each distinct angle of incidence on substrate 516 causes scattered radiation to experience different aberrations.

In some embodiments, a uncertainty of an optical measurement may be due to wafer stack thickness(es) variations. The stack thickness may vary due to, for example, variations and uncertainties in lithographic processes. Uncertainties arising from lithographic process variations may be unpredictable and difficult to calibrate out. Consequently, properties of scattered radiation 518 may be changed by some uncertain amount.

The examples explained so far show how the size of target 514 influences uncertainty of optical measurements. For example, a large target 514 (e.g., greater than 40 microns) would allow an illumination spot to remain large and still underfill target 514. A large illumination spot may alleviate a high NA requirements, and therefore uncertainties due to a large spread of angles of incidence 522 may be reduced. And by remaining underfilled, uncertainties described in reference to overfilling may be reduced as well. But making a large target goes against the current demands of the market, which is smaller devices and smaller alignment marks. Embodiments of the present disclosure provide structures and functions for reducing a spot size of radiation so as to reduce uncertainties from overfilling a target while also reducing the above mentioned uncertainties associated with coupled effects of a wide distribution of angles of incidence (e.g., due to large illumination NA), sensor aberration, and stack thickness variation.

It is instructive to present an example of optical systems in the context of a traditional beam of radiation having a Gaussian intensity distribution.

Terms such as "beam spot," "beam profile," "beam intensity profile," "spatial intensity profile," and the like may be used herein to refer to an intensity distribution throughout a cross section of a beam of radiation.

Instances where example beam diameters are disclosed, it is to be understood to be an approximate measure of beam diameter as would be commonly performed in the art (e.g., full-width at half maximum, 10/90 or 20/80 knife edge, $1/e^2$, D86, and the like).

In some embodiment, when referencing two-dimensional intensity map drawings, unless otherwise indicated, the intensity scale used herein may be a black-through-white spectrum, black indicating a dark region (low intensity) and white indicating bright region (high intensity). In some embodiments, two-dimensional intensity maps may illustrate the X-Y plane of a beam while the beam is understood to propagate in the Z direction (perpendicular to the X-Y plane). It is to be appreciated that any specific data (e.g., specific spatial dimensions) shown in graphs and intensity maps herein represent non-limiting examples.

Beam of radiation 510 may have a first spatial intensity distribution at pupil plane 528. Beam of radiation 510, when focused by lens element 506, may have a second spatial intensity distribution at a plane of target 514 (e.g., an optical conjugate).

Figure 6:
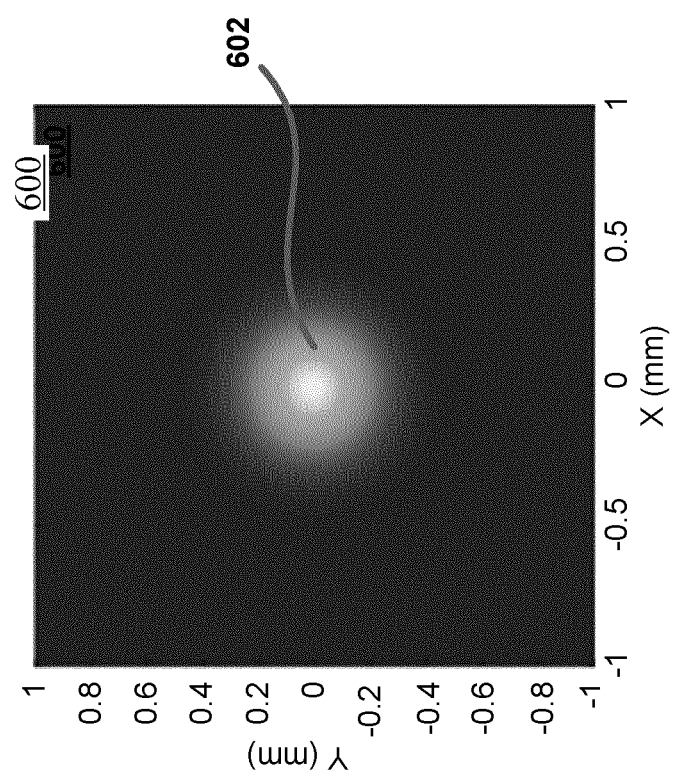
FIG. 6 shows a two-dimensional intensity map of a cross section of a beam of radiation at a pupil plane, according to some embodiments.

FIG. 6 shows a two-dimensional intensity map 600 of a cross section of a beam of radiation at a pupil plane, according to some embodiments. In some embodiments, two-dimensional intensity map 600 may correspond to the first spatial intensity distribution of beam of radiation 510 at pupil plane 528 (FIG. 5). Two-dimensional intensity map 600 shows a beam that has a Gaussian intensity profile 602 at a pupil plane. When a lens focuses the beam having Gaussian intensity profile 602, it may be shown through Fourier optics that the focused beam spot may also have a Gaussian intensity profile.

Figure 7:
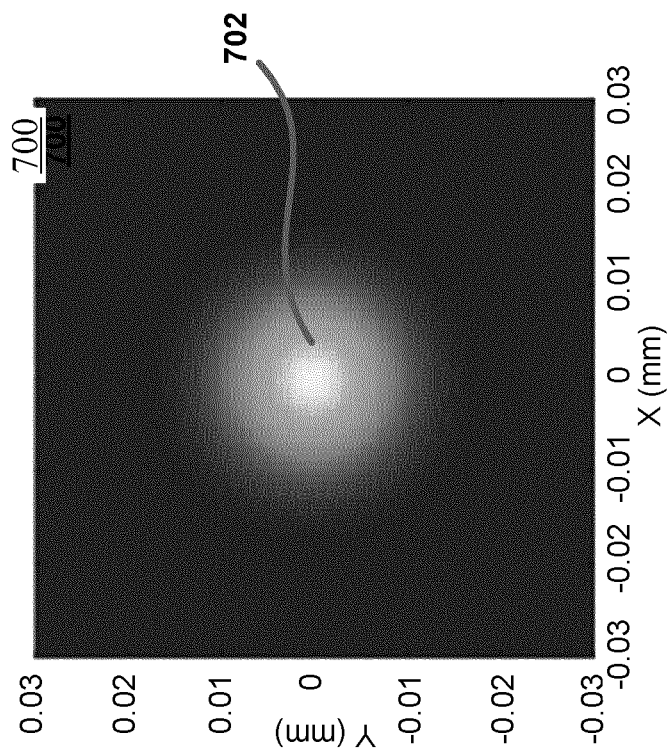
FIG. 7 shows a two-dimensional intensity map of a cross section of a beam of radiation at a substrate plane, according to some embodiments.

FIG. 7 shows a two-dimensional intensity map 700 of a cross section of a beam of radiation at a substrate plane (e.g., at a target), according to some embodiments. In some embodiments, two-dimensional intensity map 700 may correspond to the second spatial intensity distribution of beam of radiation 510 at the plane of target 514 (FIG. 5). Two-dimensional intensity map 700 shows a beam that has a Gaussian intensity profile 702 at a substrate plane, or wherever the beam is focused. Gaussian intensity profile 702 may represent a conjugate of Gaussian intensity profile 602 (FIG. 6). In order to shrink the full-width at half-maximum of Gaussian intensity profile 702, a high NA lens may be necessary, which may result in higher uncertainties in measurements if the beam of FIGS. 6 and 7 is used in a metrology system for optical inspection of substrates.

Referring back to FIG. 5, to alleviate issues of traditional Gaussian beams, in some embodiments, metrology system 500 may further comprise an optical element 526. Optical element 526 may be part of illumination system 507, along with, e.g., radiation source 502 and/or lens element 506. Optical element 526 may be disposed at or near a pupil plane 528 (e.g., illumination pupil). Lens element 506 may also be disposed at or near pupil plane 528. Optical element 526 may be used, along with lens element 506, to generate structured illumination that is capable of having a small spot size while also reducing uncertainties due to a high illumination NA.

In some embodiments, optical element 526 may modify the first spatial intensity distribution of beam of radiation 510. In some embodiments, the first spatial intensity profile may comprise an annular intensity profile (see FIG. 8). To achieve the annular intensity profile, optical element 526 may comprise at least one of an annular absorber, an annular reflector, an annular refractor, an annular aperture, and a spatial light modulator (e.g., a liquid crystal device). As beam of radiation 510 passes through the optical element, beam of radiation 510 may take on an intensity distribution having an annular shape. Lens element 506 may focus beam of radiation 510 such that the second intensity profile at the plane of target 514 may comprise an intensity profile corresponding to a central beam and one or more side lobes that are substantially isolated from the central beam (see FIG. 9). The appearance of the one or more side lobes may be due to Fourier conjugate phenomena in the optics. The one or more side lobes may be detached or substantially isolated from the central beam. Also, for a given illumination NA, the central beam may have a smaller beam diameter than with a traditional Gaussian beam.

Figures 8, 9:
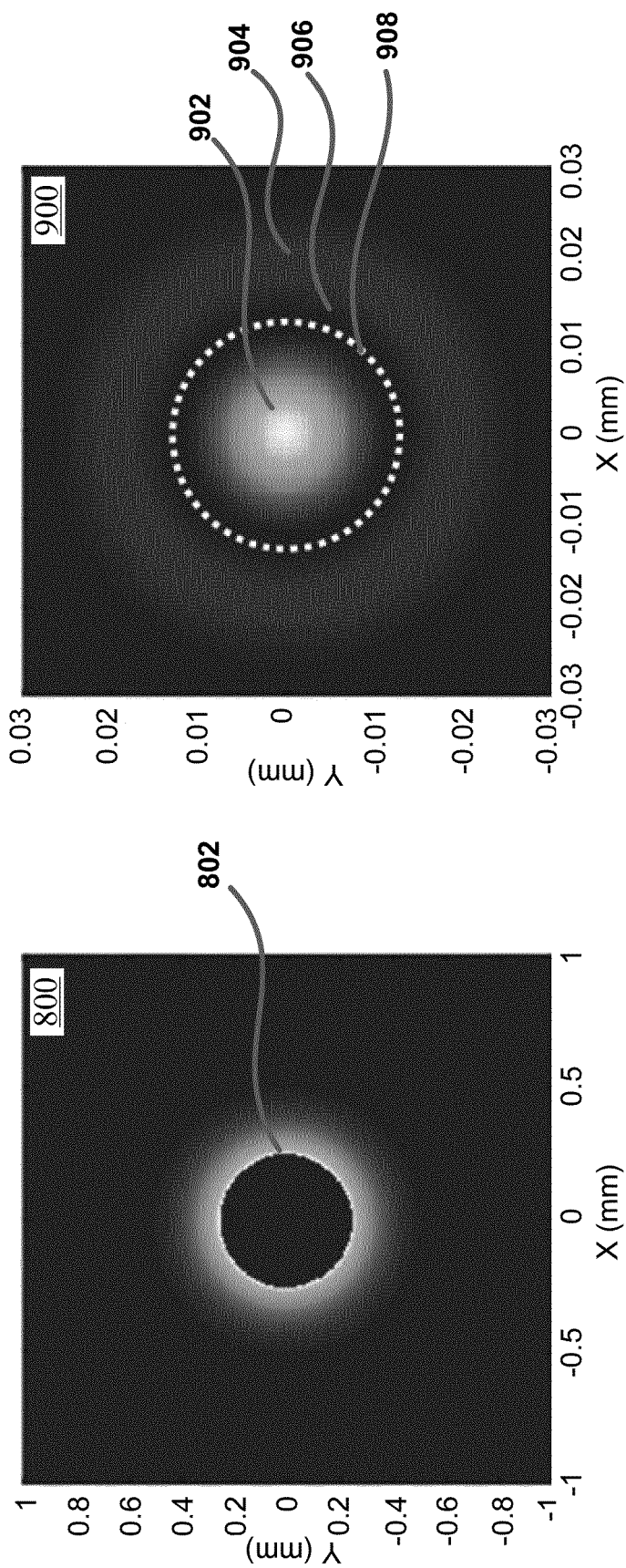
FIG. 8 shows a two-dimensional intensity map of a cross section of a beam of radiation at a pupil plane, according to some embodiments.
FIG. 9 shows a two-dimensional intensity map of a cross section of a beam of radiation at a substrate plane, according to some embodiments.

FIG. 8 shows a two-dimensional intensity map 800 of a cross section of a beam of radiation at a pupil plane (e.g. beam of radiation 510 of FIG. 5), according to some embodiments. In some embodiments, two-dimensional intensity map 800 may correspond to the first spatial intensity distribution of beam of radiation 510 at pupil plane 528 (FIG. 5). Two-dimensional intensity map 800 shows a beam that has an annular intensity profile 802 at a pupil plane. When a lens focuses the beam having annular intensity profile 802, the focused beam may comprise a central beam and an annular side lobe, as shown in FIG. 9.

FIG. 9 shows a two-dimensional intensity map 900 of a cross section of a beam of radiation at a substrate plane (e.g., at a target), according to some embodiments. In some embodiments, two-dimensional intensity map 900 may correspond to the second spatial intensity distribution of beam of radiation 510 at the plane of target 514 (FIG. 5). Two-dimensional intensity map 900 shows a beam that has a central beam 902 and an annular side lobe 904. Annular side lobe 904 is a specific non-limiting example of one or more side lobes. It should be appreciated that the number and shape of side lobes may depend on the beam interaction (e.g., beam interference) as it is focused onto an object. The spatial intensity distribution of annular side lobe 904 may correspond (e.g., by conjugate relation) to the annular intensity profile of the first spatial intensity distribution (e.g., annular intensity profile 802 in FIG. 8). Central beam 902 may have a beam diameter of approximately 20 microns or less, 15 microns or less, or 10 microns or less at a substrate plane. A dark region 906 is also present in the beam profile, which separates or substantially isolates annular side lobe 904 from central beam 902. The isolation of annular side lobe 904 allows an optical system to more easily filter out undesirable optical paths. For example, a field or aperture stop may be placed such that only radiation within area 908 is allowed through.

For example, strict tolerances for blocking element 524 (FIG. 5) may not be able to successfully clip a traditional Gaussian beam. But in the case of annular side lobe 904, its isolation from central beam 902 allows for a blocking element to more easily disallow radiation from annular side lobe 904 from reaching a detector (e.g., stops cross-talk). Since central beam 902 is reduced to 10-20 microns without the use of a high illumination NA, central beam 902 is suitable for underfilling a target having a width that is 20 microns or less while avoiding uncertainties due to high illumination NA. And radiation from annular side lobe 904 falling on structures outside of the target can be easily filtered out, which reduces uncertainties due to cross-talk.

Figure 10:
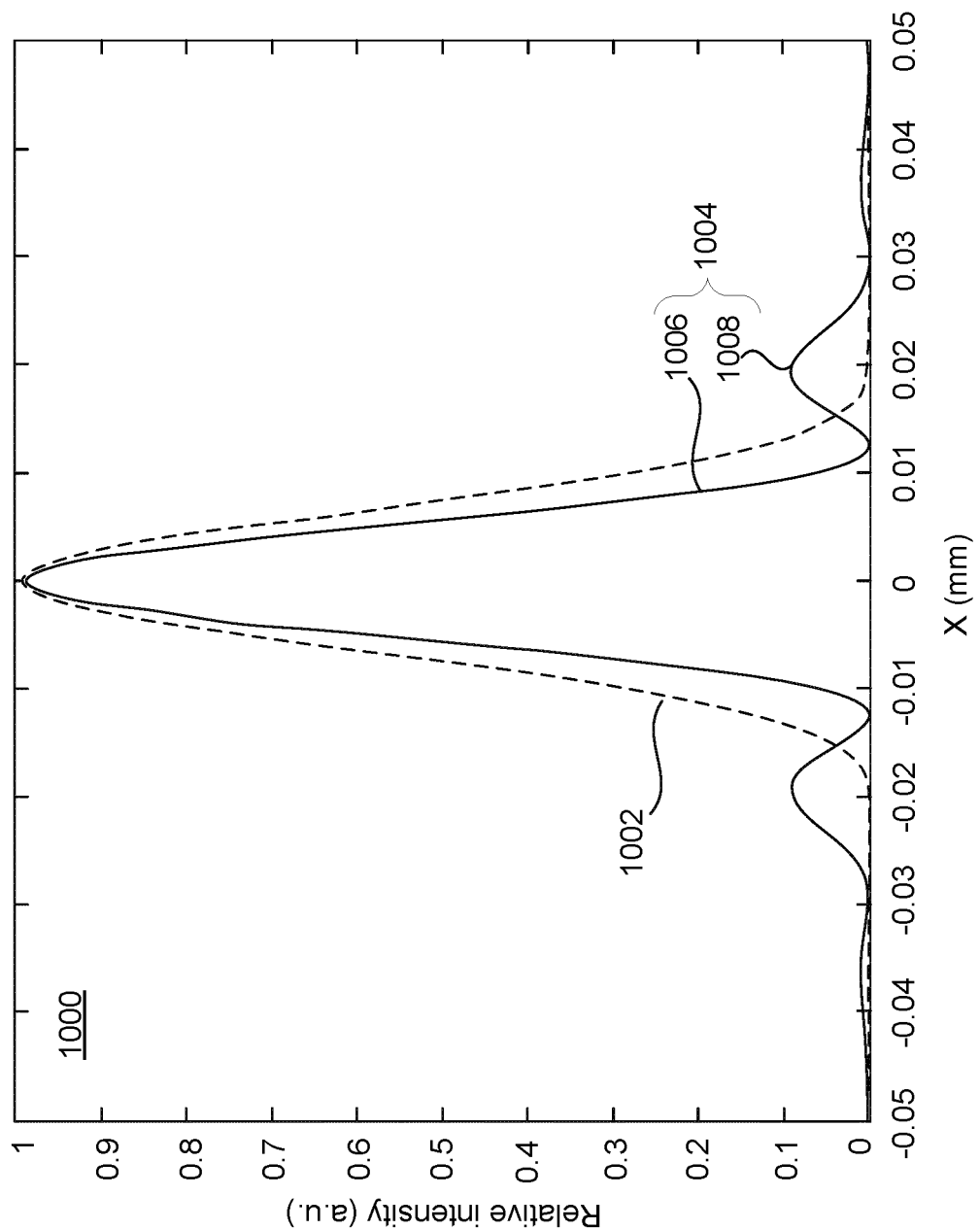
FIG. 10 shows a graph comparing a standard Gaussian beam and a beam having a structured illumination similar to FIG. 9, according to some embodiments.

FIG. 10 shows a graph 1000 comparing a standard Gaussian beam and a beam having a structured illumination similar to FIG. 9, according to some embodiments. The vertical axis represents a relative intensity, in arbitrary units (a. u.), of a beam at a substrate plane or surface. The horizontal axis represents a line that lies on the X-Y plane of a beam of radiation—in this non-limiting example, the X-axis. The dashed plot line represents a Gaussian beam 1002 (e.g., as in FIG. 7) at a substrate plane. The solid plot line represents a structured illumination 1004 having a central beam 1006 and one or more side lobes 1008 (e.g., annular side lobe, as in FIG. 9) at a substrate plane. In some embodiments, both plot lines are simulated at a given illumination NA. The simulation may be performed, for example, by taking a Fourier transform of the pupil plane intensities (e.g., FIGS. 6 and 8). The data in graph 1000 shows that the width of central beam 1006 is smaller than the width of Gaussian beam 1002. In other words, using a structured illumination (e.g., annular illumination) at a pupil plane can reduce the beam diameter at a substrate plane without increasing the NA of the illumination system as compared to the beam diameter of a Gaussian beam under similar conditions. While one or more side lobes 1008 cover an illumination area wider than central beam 1006, one or more side lobes 1008 are substantially isolated from central beam 1006. Therefore it may be easier to filter out one or more side lobes 1008 (e.g., using an aperture stop) than it is to manage the radiation from the Gaussian tail of Gaussian beam 1002.

Other structured illumination at a pupil plane may be used for reducing a beam diameter. Referring back to FIG. 5, in some embodiments, the first intensity profile may comprise an intensity profile corresponding to three or more beams (see FIGS. 11 and 12). To achieve an intensity profile corresponding to three or more beams, optical element 526 may comprise a beam splitting element (e.g., an apodizing filter or a system of beam splitting and beam directing elements). As beam of radiation 510 passes through the beam splitting element, beam of radiation 510 may take on an intensity distribution corresponding to three or more beams. In some embodiments, radiation source 502 comprises three or more radiation source elements 530. Three or more radiation source elements 530 may be used as an alternative or in addition to optical element 526. Three or more radiation source elements 530 may correspondingly generate three or more beams. Lens element 506 may focus beam of radiation 510 (having the three or more beams) such that the second intensity profile at the plane of target 514 may comprise an intensity profile corresponding to a central beam and one or more side lobes that are substantially isolated from the central beam (see FIG. 13) Similar to the annular intensity profile embodiments, for a given illumination NA, the central beam may have a smaller beam diameter than with a traditional Gaussian beam.

Figure 11:
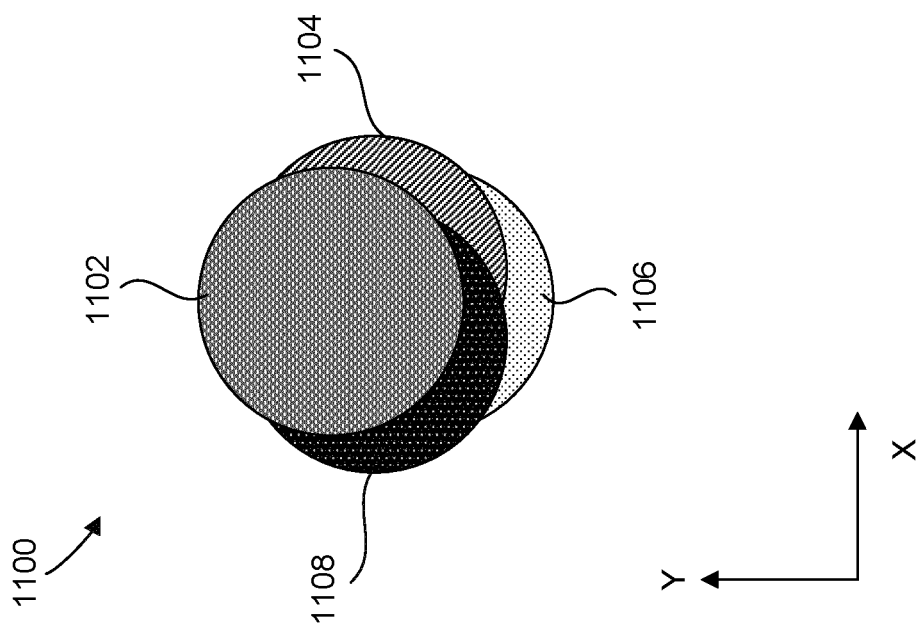

FIG. 11 shows a cross-sectional schematic of beam of radiation 1100 at a pupil plane, according to some embodiments. Four beams are used to illustrate a non-limiting example of using three or more beams in a pupil plane. In an embodiment, beam of radiation 1100 may be a structured illumination that comprises beams of radiation 1102, 1104, 1106, and 1108 at a pupil plane. Beams of radiation 1102, 1104, 1106, and 1108 may be generated using, for example, optical element 526 and/or three or more radiation source elements 530 (FIG. 5). Beams of radiation 1102, 1104, 1106, and 1108 may be substantially similar, for example, copies of a beam. Beams of radiation 1102, 1104, 1106, and 1108 may be arranged such that their respective optical axes are disposed substantially equidistant from each other. Beams of radiation 1102, 1104, 1106, and 1108 may be arranged such that they partially overlap.

Figure 12:
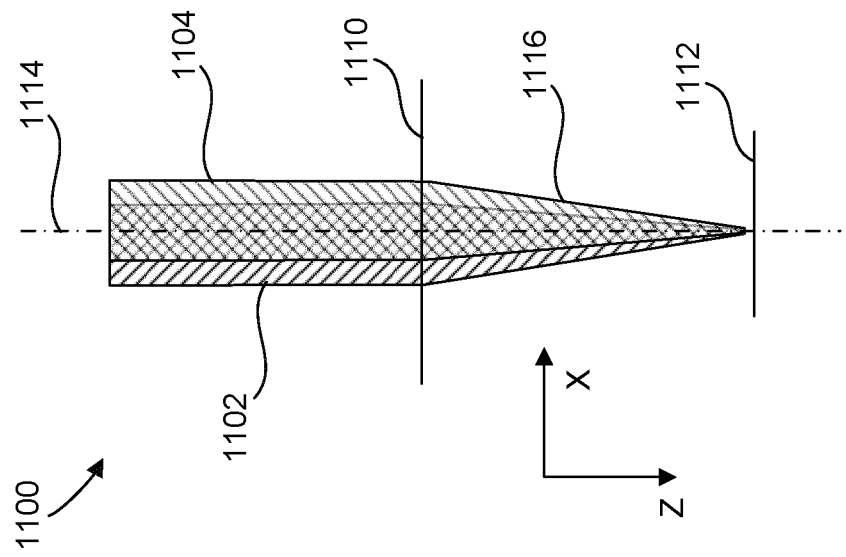
FIGS. 11 and 12 show cross-sectional schematics of beam of radiation at a pupil plane, according to some embodiments.

FIG. 12 shows another cross-sectional schematic of beam of radiation 1100 having a structured illumination, according to some embodiments. For drawing clarity, beams of radiation 1106 and 1108 are not shown, but should be understood to be present. The cross-sectional view of FIG. 12 is along the X-Z plane, which allows for depictions of clarifying elements, such as a pupil plane 1110, a substrate plane 1112, and a primary optical axis 1114 of beam of radiation 1100. The structures and functions described above in reference to FIG. 5 may be used to generate beam of radiation 1100. In some embodiments, when beam of radiation 1100 is focused, beam of radiation 1100 may form a cone of radiation 1116 that forms a beam spot at substrate plane 1112. Beam of radiation 1100 may comprise a range of angles of incidence that depends on the illumination NA. In some embodiments, a low illumination NA may be used so as to make cone of radiation 1116 elongated and narrow (e.g., a pencil-shaped beam having a narrow spread of angles of incidence). By combining three or more beams, the beam spot formed at substrate plane 1112 may be smaller than a Gaussian beam that uses a similar illumination NA.

Figure 13:
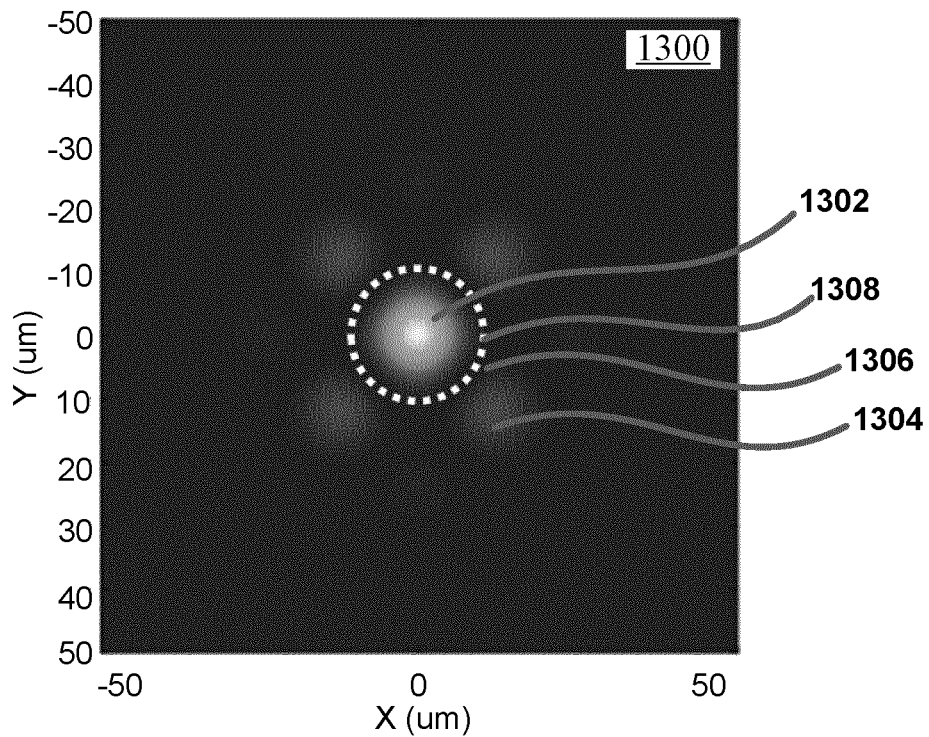
FIG. 13 shows a two-dimensional intensity map of a cross section of a beam of radiation at a substrate plane, according to some embodiments.

FIG. 13 shows a two-dimensional intensity map 1300 of a cross section of a beam of radiation at a substrate plane (e.g., at a target), according to some embodiments. In some embodiments, two-dimensional intensity map 1300 may correspond to the second spatial intensity distribution of beam of radiation 510 at the plane of target 514 (FIG. 5). Two-dimensional intensity map 1300 shows a beam that has a central beam 1302 and one or more side lobes 1304—in this non-limiting example, four side lobes. It should be appreciated that the number and shape of side lobes may depend on the number of beams and/or beam interaction (e.g., beam interference) as they are focused onto an object. Central beam 1302 may have a beam diameter of approximately 20 microns or less, 15 microns or less, or 10 microns or less at a substrate plane. A dark region 1306 is also present in the beam profile, which separates or substantially isolates one or more side lobes 1304 from central beam 1302. The isolation of one or more side lobes 1304 allows an optical system to more easily filter out undesirable optical paths. For example, a field or aperture stop may be placed such that only radiation within area 1308 is allowed through.

Similar to embodiments with annular side lobe 904 (FIG. 9), the isolation of side lobes from central beam 1302 allows for a blocking element to more easily disallow radiation from one or more side lobe 1304 from reaching a detector (e.g., stops cross-talk). Since central beam 1302 is reduced to 10-20 microns without the use of a high illumination NA, central beam 1302 is suitable for underfilling a target having a width that is 20 microns or less while avoiding uncertainties due to high illumination NA. And radiation from one or more side lobes 1304 falling on structures outside of the target can be easily filtered out, which reduces uncertainties due to cross-talk.

Figure 14:
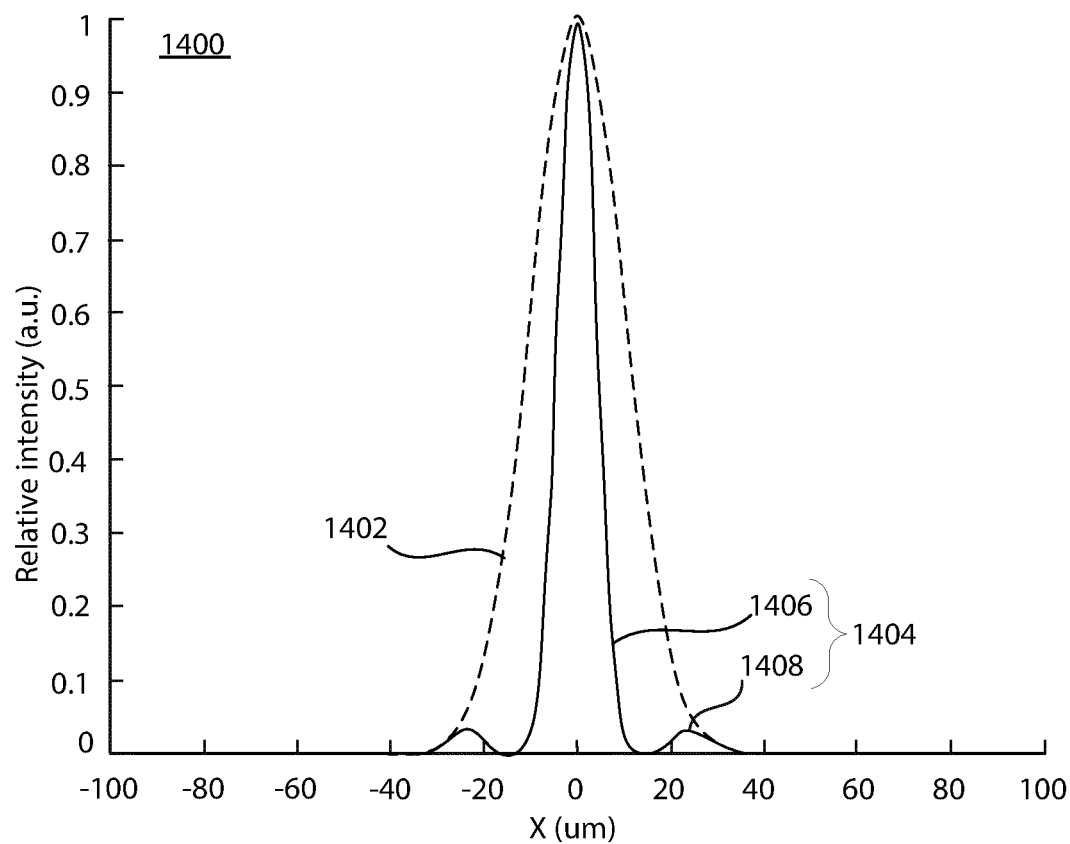
FIG. 14 shows a graph comparing a standard Gaussian beam and a beam having a structured illumination similar to FIG. 13, according to some embodiments.

FIG. 14 shows a graph 1400 comparing a standard Gaussian beam and a beam having a structured illumination similar to FIG. 13, according to some embodiments. The vertical axis represents a relative intensity, in arbitrary units (a. u.), of a beam at a substrate plane or surface. The horizontal axis represents a line that lies on the X-Y plane of a beam of radiation—in this non-limiting example, the X-axis. The dashed plot line represents a Gaussian beam 1402 (e.g., as in FIG. 7) at a substrate plane. The solid plot line represents a structured illumination 1404 having a central beam 1406 and one or more side lobes 1408 at a substrate plane. In some embodiments, both plot lines are simulated at a given illumination NA. The simulation may be performed, for example, by taking a Fourier transform of the pupil plane intensities. The data in graph 1400 shows that the width of central beam 1406 is smaller than the width of Gaussian beam 1402. In other words, using a structured illumination (e.g., three or more beams) at a pupil plane can reduce the beam diameter at a substrate plane without increasing the NA of the illumination system as compared to the beam diameter of a Gaussian beam under similar conditions. While one or more side lobes 1408 cover an illumination area wider than central beam 1406, one or more side lobes 1408 are substantially isolated from central beam 1406. Therefore it may be easier to filter out one or more side lobes 1008 (e.g., using an aperture stop) than it is to manage the radiation from the Gaussian tail of Gaussian beam 1402.

The embodiments may further be described using the following clauses:

1. A system comprising:
an illumination system configured to generate a beam of radiation having a first spatial intensity distribution at a pupil plane and a second spatial intensity distribution at a plane of a target, wherein the first spatial intensity distribution comprises an annular intensity profile or an intensity profile corresponding to three or more beams;
a lens element configured to focus the beam onto the target, wherein the second spatial intensity distribution is a conjugate of the first intensity distribution and comprises an intensity profile corresponding to a central beam and one or more side lobes that are substantially isolated from the central beam, and wherein the central beam has a beam diameter of approximately 20 microns or less at the target; and
a detector configured to receive radiation scattered by the target and to generate a measurement signal based on the received radiation.

2. The system of clause 1, wherein the central beam has a beam diameter of approximately 15 or less microns at the target.

3. The system of clause 1, wherein the central beam has a beam diameter of approximately 10 microns or less at the target.

4. The system of clause 1, wherein the central beam underfills the target.

5. The system of clause 1, further comprising a filter element configured to stop stray radiation from reaching the detector, wherein the stray radiation comprises radiation from the one or more side lobes that has been scattered by the target.

6. The system of clause 5, wherein the filter element is further configured to reduce interference of the received radiation.

7. The system of clause 5, wherein the filter element comprises an adjustable aperture.

8. The system of clause 1, wherein:
the illumination system comprises an optical element comprising at least one of an annular absorber, an annular reflector, an annular refractor, an annular aperture, and a spatial light modulator;
the optical element is configured to generate the annular intensity profile of the first spatial intensity distribution; and
the one or more side lobes comprise an annular intensity profile corresponding to the annular intensity profile of the first spatial intensity distribution.

9. The system of clause 1, wherein the illumination system comprises three or more radiation sources configured to correspondingly generate the three or more beams.

10. The system of clause 1, wherein the illumination system comprises a beam splitting element configured to split the beam to generate the intensity profile corresponding to the three or more beams.

11. The system of clause 1, wherein optical axes of the three or more beams are disposed substantially equidistant from each other.

12. The system of clause 1, wherein:
the lens element is further configured to focus the three or more beams such that an average angle of incidence of the three or more beams on the target is approximately less than 2 degrees.

13. The system of clause 12, wherein the average angle of incidence is approximately less than 1 degree.

14. The system of clause 1, wherein the system is configured to scan the beam across the target and to determine a position of the target based on the measurement signal.

15. A system comprising:
an illumination system configured to generate a beam of radiation having a first spatial intensity distribution at a pupil plane and a second spatial intensity distribution at a plane of a target, wherein the first spatial intensity distribution comprises an annular intensity profile or an intensity profile corresponding to three or more beams, the illumination system comprising:
  an annular optical element configured to generate the annular intensity profile of the first spatial intensity distribution; or
  a beam splitting element configured to split the beam to generate the intensity profile corresponding to the three or more beams of the first spatial intensity distribution,
  a lens element configured to focus the beam onto the target, wherein the second spatial intensity distribution is a conjugate of the first intensity distribution and comprises an intensity profile corresponding to a central beam and one or more side lobes that are substantially isolated from the central beam; and
  a detector configured to receive radiation scattered by the target and to generate a measurement signal based on the received radiation.

16. The system of clause 15, wherein:
  the annular optical element comprises at least one of an annular absorber, an annular reflector, an annular refractor, an annular aperture, and a spatial light modulator; and
  the one or more side lobes comprise an annular intensity profile corresponding to the annular intensity profile of the first spatial intensity distribution.

17. A system comprising:
  an illumination system configured to generate a beam of radiation having a first spatial intensity distribution at a pupil plane and a second spatial intensity distribution at a plane of a target, wherein the first spatial intensity distribution comprises an intensity profile corresponding to three or more beams, the illumination system comprising three or more radiation sources configured to correspondingly generate the three or more beams;
  a lens element configured to focus the three or more beams onto the target, wherein the second spatial intensity distribution is a conjugate of the first intensity distribution and comprises an intensity profile corresponding to a central beam and one or more side lobes that are substantially isolated from the central beam; and
  a detector configured to receive radiation scattered by the target and to generate a measurement signal based on the received radiation.

18. The system of clause 17, wherein optical axes of the three or more beams are disposed substantially equidistant from each other.

19. The system of clause 17, wherein the lens element is further configured to focus the three or more beams such that an average angle of incidence of the three or more beams on the target is approximately less than 2 degrees.

20. A lithographic apparatus comprising:
  a first illumination system configured to illuminate a pattern of a patterning device;
  a support configured to support the patterning device;
  a substrate table configured to support a substrate;
  a projection system configured to project an image of the pattern onto the substrate; and
  a metrology system comprising:
    a second illumination system configured to generate a beam of radiation having a first spatial intensity distribution at a pupil plane and a second spatial intensity distribution at a plane of a target on the substrate, wherein the first spatial intensity distribution comprises an annular intensity profile or an intensity profile corresponding to three or more beams;
    a lens element configured to focus the beam onto the target, wherein the second spatial intensity distribution is a conjugate of the first intensity distribution and comprises an intensity profile corresponding to a central beam and one or more side lobes that are substantially isolated from the central beam, and wherein the central beam has a beam diameter of approximately less than 20 microns at the target; and
    a detector configured to receive radiation scattered by the target and to generate a measurement signal based on the received radiation.

Although specific reference can be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track unit (a tool that typically applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention can be used in other applications, for example imprint lithography, and where the context allows, is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present disclosure is to be interpreted by those skilled in relevant art(s) in light of the teachings herein.

The term "substrate" as used herein describes a material onto which material layers are added. In some embodiments, the substrate itself can be patterned and materials added on top of it may also be patterned, or may remain without patterning.

Although specific reference can be made in this text to the use of the apparatus and/or system according to the invention in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments of the invention have been described above, it will be appreciated that the invention can be practiced otherwise than as described. The description is not intended to limit the invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

The breadth and scope of the present invention should not be limited by any of the above-described exemplary embodiments, but should be defined only in accordance with the following claims and their equivalents.

The invention claimed is:

1. A system comprising:
an illumination system configured to generate a beam of radiation having a first spatial intensity distribution at a pupil plane and a second spatial intensity distribution at a plane of a target, wherein the first spatial intensity distribution comprises an annular intensity profile or an intensity profile corresponding to three or more beams;
a lens element configured to focus the beam onto the target, wherein the second spatial intensity distribution is a conjugate of the first intensity distribution and comprises an intensity profile corresponding to a central beam and one or more side lobes that are substantially isolated from the central beam, and wherein the central beam has a beam diameter of approximately 20 microns or less at the target; and
a detector configured to receive radiation scattered by the target and to generate a measurement signal based on the received radiation.

2. The system of claim 1, wherein the central beam has a beam diameter of approximately 15 or less microns at the target.

3. The system of claim 1, wherein the central beam has a beam diameter of approximately 10 microns or less at the target.

4. The system of claim 1, wherein the central beam underfills the target.

5. The system of claim 1, further comprising a filter element configured to stop stray radiation from reaching the detector, wherein the stray radiation comprises radiation from the one or more side lobes that has been scattered by the target.

6. The system of claim 5, wherein the filter element is further configured to reduce interference of the received radiation.

7. The system of claim 5, wherein the filter element comprises an adjustable aperture.

8. The system of claim 1, wherein:
the illumination system comprises an optical element comprising at least one of an annular absorber, an annular reflector, an annular refractor, an annular aperture, and a spatial light modulator;
the optical element is configured to generate the annular intensity profile of the first spatial intensity distribution; and
the one or more side lobes comprise an annular intensity profile corresponding to the annular intensity profile of the first spatial intensity distribution.

9. The system of claim 1, wherein the illumination system comprises three or more radiation sources configured to correspondingly generate the three or more beams.

10. The system of claim 1, wherein the illumination system comprises a beam splitting element configured to split the beam to generate the intensity profile corresponding to the three or more beams.

11. The system of claim 1, wherein optical axes of the three or more beams are disposed substantially equidistant from each other.

12. The system of claim 1, wherein:
the lens element is further configured to focus the three or more beams such that an average angle of incidence of the three or more beams on the target is approximately less than 2 degrees.

13. The system of claim 12, wherein the average angle of incidence is approximately less than 1 degree.

14. The system of claim 1, wherein the system is configured to scan the beam across the target and to determine a position of the target based on the measurement signal.

15. A lithographic apparatus comprising:
a first illumination system configured to illuminate a pattern of a patterning device;
a support configured to support the patterning device;
a substrate table configured to support a substrate;
a projection system configured to project an image of the pattern onto the substrate; and
a metrology system comprising:
a second illumination system configured to generate a beam of radiation having a first spatial intensity distribution at a pupil plane and a second spatial intensity distribution at a plane of a target on the substrate, wherein the first spatial intensity distribution comprises an annular intensity profile or an intensity profile corresponding to three or more beams;
a lens element configured to focus the beam onto the target, wherein the second spatial intensity distribution is a conjugate of the first spatial intensity distribution and comprises an intensity profile corresponding to a central beam and one or more side lobes that are substantially isolated from the central beam, and wherein the central beam has a beam diameter of approximately less than 20 microns at the target; and
a detector configured to receive radiation scattered by the target and to generate a measurement signal based on the received radiation.

16. The system of claim 15, wherein:

the lens element comprises at least one of an annular absorber, an annular reflector, an annular refractor, an annular aperture, and a spatial light modulator; and the one or more side lobes comprise an annular intensity profile corresponding to the annular intensity profile of the first spatial intensity distribution.

17. A system comprising:

an illumination system configured to generate a beam of radiation having a first spatial intensity distribution at a pupil plane and a second spatial intensity distribution at a plane of a target, wherein the first spatial intensity distribution comprises an intensity profile corresponding to three or more beams, the illumination system comprising three or more radiation sources configured to correspondingly generate the three or more beams;

a lens element configured to focus the three or more beams onto the target, wherein the second spatial intensity distribution is a conjugate of the first spatial intensity distribution and comprises an intensity profile corresponding to a central beam and one or more side lobes that are substantially isolated from the central beam; and a detector configured to receive radiation scattered by the target and to generate a measurement signal based on the received radiation.

18. The system of claim 17, wherein optical axes of the three or more beams are disposed substantially equidistant from each other.

19. The system of claim 17, wherein the lens element is further configured to focus the three or more beams such that an average angle of incidence of the three or more beams on the target is approximately less than 2 degrees.

20. A lithographic apparatus comprising:

a first illumination system configured to illuminate a pattern of a patterning device;

a support configured to support the patterning device;

a substrate table configured to support a substrate;

a projection system configured to project an image of the pattern onto the substrate; and a metrology system comprising:

a second illumination system configured to generate a beam of radiation having a first spatial intensity distribution at a pupil plane and a second spatial intensity distribution at a plane of a target on the substrate, wherein the first spatial intensity distribution comprises an annular intensity profile or an intensity profile corresponding to three or more beams;

a lens element configured to focus the beam onto the target, wherein the second spatial intensity distribution is a conjugate of the first spatial intensity distribution and comprises an intensity profile corresponding to a central beam and one or more side lobes that are substantially isolated from the central beam, and wherein the central beam has a beam diameter of approximately less than 20 microns at the target; and a detector configured to receive radiation scattered by the target and to generate a measurement signal based on the received radiation.

\* \* \* \* \*

UNITED STATES PATENT AND TRADEMARK OFFICE
CERTIFICATE OF CORRECTION

| | |
|---|---|
| PATENT NO. | : 11,789,368 B2 |
| APPLICATION NO. | : 17/764139 |
| DATED | : October 17, 2023 |
| INVENTOR(S) | : Lin et al. |

It is certified that error appears in the above-identified patent and that said Letters Patent is hereby corrected as shown below:

In the Claims

In Column 29, Claim 16, Line 1, delete "system" and insert --apparatus--.

Signed and Sealed this
Twentieth Day of February, 2024

Katherine Kelly Vidal
*Director of the United States Patent and Trademark Office*